(12) United States Patent
Jin

(10) Patent No.: US 10,205,078 B2
(45) Date of Patent: Feb. 12, 2019

(54) NATURAL HEAT ENERGY CONVERSION AND STORAGE DEVICE

(71) Applicants: LANZHOU JINFULE BIOTECHNOLOGY CO. LTD., Gansu (CN); KIN STAR INTERNATIONAL LIMITED, Road Town (VG); SPRING POWER LIMITED, Road Town (VG); JIN JIN PACIFIQUE COMPAGNIE, Antony (FR)

(72) Inventor: Jifan Jin, Gansu (CN)

(73) Assignees: Lanzhou Jinfule Biotechnology Co. Ltd, Gansu (CN); Kin Star International Limited, Road Town (VG); Spring Power Limited, Road Town (VG); Jin Jin Pacifique Compagnie, Antony (FR)

( * ) Notice: Subject to any disclaimer, the term of this patent is extended or adjusted under 35 U.S.C. 154(b) by 432 days.

(21) Appl. No.: 14/758,533

(22) PCT Filed: Dec. 30, 2013

(86) PCT No.: PCT/CN2013/001666
§ 371 (c)(1),
(2) Date: Sep. 21, 2015

(87) PCT Pub. No.: WO2014/101300
PCT Pub. Date: Jul. 3, 2014

(65) Prior Publication Data
US 2016/0005945 A1 Jan. 7, 2016

(30) Foreign Application Priority Data

Dec. 28, 2012 (CN) .......................... 2012 1 0583553

(51) Int. Cl.
*H01L 35/28* (2006.01)
*F28D 20/00* (2006.01)
(Continued)

(52) U.S. Cl.
CPC .............. *H01L 35/28* (2013.01); *F28D 15/02* (2013.01); *F28D 20/00* (2013.01); *H01L 35/30* (2013.01); *Y02E 60/142* (2013.01)

(58) Field of Classification Search
CPC .......... H01L 35/28; H01L 35/02–35/34; F28D 15/0208–15/0291; F28D 15/02
(Continued)

(56) References Cited

U.S. PATENT DOCUMENTS 4,292,579 A * 9/1981 Constant ................. H01L 35/00
136/203
5,969,290 A * 10/1999 Kagawa .................. H01L 35/08
136/201
8,643,999 B2 * 2/2014 Yeo ....................... H05K 9/0081
361/235

FOREIGN PATENT DOCUMENTS

CN 1900517 A 1/2007
CN 201639513 U 11/2010
(Continued)

*Primary Examiner* — Niki Bakhtiari
(74) *Attorney, Agent, or Firm* — Knobbe, Martens, Olson & Bear, LLP

(57) ABSTRACT

A natural heat energy conversion and storage device includes: a heat energy transmission system, an energy conversion system, and an energy storage unit. The heat energy transmission system is used for performing large-scale collection of heat energy through an energy absorption and expansion unit, and transferring the heat energy to a heated end of a heat pipe, which can be superconducting. The heat pipe transfers the heat energy to an energy conversion unit where the heat energy can be converted into electric energy. The energy conversion unit is used for
(Continued)

converting the heat energy collected by the heat energy transmission system into electric energy, and storing the generated electric energy into the energy storage unit. The number of modules of the energy conversion unit is at least one. The energy storage unit is used for storing the electric energy obtained through conversion by the energy conversion unit.

11 Claims, 17 Drawing Sheets

(51) Int. Cl.
  *H01L 35/30* (2006.01)
  *F28D 15/02* (2006.01)
(58) Field of Classification Search
  USPC .................................. 136/200–242
  See application file for complete search history.

(56) References Cited

FOREIGN PATENT DOCUMENTS

| | | |
|---|---|---|
| CN | 102299252 A | 12/2011 |
| CN | 102570918 A | 7/2012 |
| CN | 103174612 A | 6/2013 |

\* cited by examiner

NATURAL HEAT ENERGY CONVERSION AND STORAGE DEVICE

TECHNICAL FIELD

The present invention relates to the field of power generation technology, and particularly to a conversion and storage device of natural thermal energy.

BACKGROUND ART

With continuous development of science and technology, demand for energy is increasingly urgent in various industries. At present, most power generation systems still use relative conventional approaches, such as using coal etc., to generate power. At the one hand, the resource of coal is limited, incapable of meeting requirements for generating power at high capacity, and on the other hand, the usage of coal aggravates pollution and damage to the natural environment, and is disadvantageous to environmental protection.

In recent years, the wind, hydro, and nuclear power generation technologies and the like are developed gradually, however these technologies consume great energy and huge cost, and also they are very vulnerable to natural external environment, causing the power generation capacity to be limited to a certain extent, therefore it is incapable of meeting requirements for electrical power in various industries.

DISCLOSURE OF THE INVENTION

(I) Technical Problems to be Solved

The technical problems to be solved by the present invention are defects in the prior art that the existing power generation devices consume great energy and huge cost, are disadvantageous to environment protection, and have limited power generation capacity.

(II) Technical Solutions

In order to solve the above technical problems, the present invention provides a conversion and storage device of natural thermal energy, comprising: a thermal energy transfer system, an energy conversion device, an energy storage device, wherein the thermal energy transfer system is configured to collect for large-scale thermal energy by an energy absorption and extension device, and then the thermal energy is transferred to a heating end of a heat pipe or a superconductor heat pipe and further transferred through the heat pipe or the superconductor heat pipe to the energy conversion device, which converts the thermal energy to electrical energy;

the energy conversion device is configured to convert the thermal energy collected by the thermal energy transfer system into electrical energy, and then the generated electrical energy is stored in the energy storage device, the energy conversion device, placed in a vacuum tank, is a device for converting natural heat to electrical energy, which is composed of a positive electrode, semiconductor material, a negative electrode, a mosaic structure formed of conductor material and semiconductor material and an accessory structure; and the number of modules of the energy conversion device is at least one; and the energy storage device is configured for storing the electrical energy converted by the energy conversion device.

Further, the thermal energy transfer system comprises an energy absorption and extension device, a heat pipe or a superconductor heat pipe, and an accessory supporting structure, wherein the heat pipe or the superconductor heat pipe has one end connected with the energy absorption and extension device that communicates with a heat source in external environment and the other end connected with the energy conversion device so as to transfer the thermal energy in the external environment to the energy conversion device which is composed of a positive electrode, semiconductor material, a negative electrode, a mosaic structure formed of conductor material and semiconductor material.

Further, the energy conversion device is formed of energy conversion modules comprising a vacuum tank, a vacuum environment, the positive electrode, the semiconductor material, the negative electrode, the mosaic structure formed of conductor material and semiconductor material and the accessory structure, wherein the vacuum tank is at the outermost layer of the whole device to form an enclosed tank, which is configured to fix and support internal devices and technically support the internal vacuum environment, and the entire space within the vacuum tank forms a vacuum environment, and wherein one side of the positive electrode is tightly seamlessly integrally joined with the semiconductor material and the other side of the positive electrode is connected with the energy storage device through an electrical transmission line, the positive electrode is formed of conductor material with a high electrical conductivity, in a sheet shape, a layered shape, an irregular shape, or an amorphous shape, in form of solid, liquid or plasma state, the positive electrode is not in communication with the mosaic structure composed of the semiconductor material and the negative electrode, and at the same time, the surface area of a contact portion between the positive electrode and the semiconductor material is less or significantly less than the surface area of a contact portion between the negative electrode and the semiconductor material;

the contact portion between the positive electrode and the semiconductor material represents a portion of the positive electrode which is tightly seamlessly integrally joined with the semiconductor material; the contact portion between the negative electrode and the semiconductor material represents a portion of the negative electrode which is tightly seamlessly joined with the semiconductor material;

wherein one side of the semiconductor material is tightly seamlessly integrally joined with the positive electrode and the other side of the semiconductor material is tightly seamlessly integrally joined with the negative electrode, and at the same time, the semiconductor material and the negative electrode are joined integrally in a mosaic structure, with the semiconductor material in a sheet shape, a layered shape, an irregular shape, or an amorphous shape, in form of solid, liquid or plasma state;

wherein one side of the negative electrode is tightly seamlessly integrally joined with the semiconductor material while the semiconductor material and the negative electrode are joined integrally in a mosaic structure, and the other side of the negative electrode is connected with the energy storage device through an electrical transmission line, and the negative electrode is formed of conductor material with a high electrical conductivity in a sheet shape, a layered shape, an irregular shape, or an amorphous shape, in form of solid, liquid or plasma state, and the negative electrode is in communication with the mosaic structure composed of the semiconductor material and the negative electrode, such that electrons produced by the semiconductor material under thermal excitation can be guided away to form electrical current;

wherein the mosaic structure composed of the negative electrode and the semiconductor material is a super-micro structure which comprises nano super-micro structure of 1 nm-100 nm and micron super-micro structure of 0.1 μm-10 μm, the mosaic structure is mutually mosaic, comprising the negative electrode being embedded into the semiconductor material or the semiconductor being embedded into material of the negative electrode.

Further, the mosaic structure comprises: regular forms in which convex bodies with super-micro longitudinal or lateral widths, a super-micro height and a super-micro interval are embedded into the semiconductor material; or widely spread column structures which have a super-micro diameter, a super-micro height, and a super-micro distance are embedded into the semiconductor material; or widely spread cavity structures which have a super-micro diameter, a super-micro depth, and a super-micro distance are embedded into the semiconductor material; or cavity structures in a cube form with a super-micro width multiplying a super-micro length, a super-micro depth, and a super-micro distance are embedded into the semiconductor material;

cavity structures in a cube form with a super-micro length multiplying a super-micro width, a super-micro convex height, and a super-micro distance are embedded into the semiconductor material, and the mosaic structure comprises organism-like (similar to organism) small intestinal chorionic structure, namely the cathode being embedded into the semiconductor material, similarly in structure to the small intestine chorionic, being embedded into a chyme; and the mosaic structure comprises irregular forms including the negative electrode being immersed into the semiconductor material or the negative electrode being dissolved into the semiconductor material, and at the same time, the negative electrode being connected with the negative electrode of the energy storage device through an electrical transmission line.

Further, the energy conversion device is composed of a vacuum tank, a vacuum environment, conductor material, semiconductor material, an absorption heat pipe or superconductor heat pipe, and a dissipation heat pipe or superconductor heat pipe, wherein, the vacuum tank is at the outermost layer of the whole device to form an enclosed tank, which is configured to fix and support internal energy conversion device, secure the heat pipe or the superconductor heat pipe for absorbing thermal energy at the high temperature end and the heat pipe or the superconductor heat pipe for dispersing thermal energy at the low temperature end for technically supporting the internal vacuum environment, and the entire space within the vacuum tank forms a vacuum environment, the energy conversion device of the present invention is composed of the conductor material and the semiconductor material embedded or doped into the conductor material, the absorbing heat end of the heat pipe or superconductor heat pipe for absorbing thermal energy is connected with a heat source, the dispersing end of the heat pipe or the superconductor heat pipe for dispersing thermal energy is connected with a high temperature end of the energy conversion device, the high temperature end is connected with one side of the energy conversion device so as to transfer the thermal energy of the heat source to the energy conversion device through the heat pipe or the superconductor heat pipe, the low temperature end is connected with one side of the energy conversion device, the absorbing heat end of the heat pipe or the superconductor heat pipe for dispersing the thermal energy is connected with the low temperature end, the dispersing end is connected to a low temperature heat source so as to transfer the thermal energy transmitted from the high temperature end of the energy conversion device to the low temperature heat source, such that the high temperature end and the low temperature end are kept at a corresponding temperature difference therebetween, the conductor material connected to the high temperature end is connected to the electrical transmission line to serve as the anode of the device of the present invention, the conductor material connected to the low temperature end is connected to the electrical transmission line to serve as the cathode of the device of the present invention, and the electrical energy generated by the energy conversion device is transferred to the energy storage device through the electrical transmission line;

wherein the semiconductor material is embedding or doped into the conductor, such that atoms of the semiconductor material spaced from each other can be embedded or doped to the conductor or atoms of the semiconductor material connected with each other are embedding into the conductor, and the semiconductor upon undergoing the thermal excitation generates electron-hole pairs, and separated free electrons directly enter the negative electrode directionally under effect of a electrostatic field, therefore the separation of the electron-hole pairs is no longer affected by carrier density in the semiconductor; and wherein the cathode and the conductor material are connected integrally, and the anode and the semiconductor material are connected integrally while not contacted or communicated with the conductor material.

Further, the energy conversion device comprises the vacuum tank, a vacuum environment, an electrical transmission line, the energy storage device, a high temperature end, a low temperature end, semiconductor material or semiconductor atoms, doped material or doped atoms, conductor material or conductor atoms, and electrodes, wherein the vacuum tank is at the outermost layer of the whole device to form an enclosed tank, which is configured to fix and support internal energy conversion devices and secure the heat pipe or the superconductor heat pipe for absorbing thermal energy at the high temperature end and the heat pipe or the superconductor heat pipe for dispersing thermal energy at the low temperature for technically supporting the internal vacuum environment, and the novel energy conversion device of the present invention is composed of the semiconductor material or semiconductor atoms, doped material or doped atoms, conductor material or conductor atoms, and electrodes, the absorbing heat end of the heat pipe or superconductor heat pipe for absorbing thermal energy is connected with a heat source, the dispersing end of the heat pipe or superconductor heat pipe for absorbing thermal energy is connected with a high temperature end of the energy conversion device, the high temperature end is connected with one side of the energy conversion device so as to transfer the thermal energy of the heat source to the energy conversion device through the heat pipe or the superconductor heat pipe, the low temperature end is connected with one side of the energy conversion device, the absorbing end of the heat pipe or the superconductor heat pipe for dispersing thermal energy is connected with the low temperature end, the dispersing end is connected to a low temperature heat source so as to transfer the thermal energy transmitted from the high temperature end of the energy conversion device to the low temperature heat source, such that the high temperature end and the low temperature end are kept at a corresponding temperature difference therebetween, the electrode connected to the high temperature end is connected to the electrical transmission line to serve as the positive electrode of the device of the present invention, the conductor material connected to the low temperature end is connected to the electrical transmission line to serve as the negative electrode of the device of the present invention, and the electrical energy generated by the energy conversion device is transferred to the energy storage device through the electrical transmission line, the energy conversion device has a construction in which the semiconductor material, as a frame platform of the whole energy conversion device, is permeated with appropriate doping material or doping atoms, wherein since impurity atoms provide electrical conductive carriers, the resistance of the material greatly reduces, so as to function as a doped semiconductor; and based on such structure, it is further doped with conductor material or conductor atoms, wherein the conductor material or the conductor atoms spaced from each other are doped into the doped semiconductor structure or various structures composed of conductor material atoms are embedded into the doped semiconductor structure, for forming the energy conversion device, wherein the positive and negative electrodes of the energy conversion device are determined by the way that the high temperature end serves as the positive electrode and the low temperature end serves as the negative electrode, both of the positive and negative electrodes are connected together with the semiconductor material, while the positive electrode is not in contact with the negative electrode which however is capable of communicating with the conductor doped into the semiconductor, and the positive electrode and the negative electrode do not communicate with the conductor doped into the semiconductor simultaneously.

Further, the conductor material is solid, liquid, gas or plasma; and the semiconductor material is solid, liquid, gas or plasma.

Further, the energy storage device is composed of an electrical transmission line, the energy storage device, capacitors or super capacitors, a new flywheel energy storage battery, other energy storage batteries and the like; the positive electrode and the negative electrode of the energy conversion device are connected with the energy storage device through the electrical transmission line, so as to store the electrical energy generated by the energy conversion device in the energy storage device, wherein the electrical transmission line has one end connected with the positive and negative electrodes and the other end connected with the capacitor or a super capacitor so as to store the electrical energy generated by the energy conversion device in the capacitor or the super capacitor, and then the electrical energy in the capacitor or the super capacitor is re-stored into the storage battery through electro-discharge.

Further, a protection circuit is provided between the capacitor and the energy conversion device.

Further, a protection circuit is provided between the super capacitor and the energy conversion device.

Further, the heat source comprises solar energy, air, rivers, oceans, underground heat, desert or other natural thermal energy, and also includes thermal energy, afterheat, waste heat produced in industrial and agricultural fields and other fields, and also includes thermal energy, afterheat, and waste heat generated during human life.

(III) Advantageous Effects

The above embodiments have the follows advantages: the conversion and storage device of natural thermal energy according to the present invention, through collecting thermal energy close to the device in cooperation of changing the internal feature of the semiconductor, highly effectively converts the thermal energy into electrical energy, with the convenient operation and the great power energy capacity, facilitating the environment protection.

DETAILED DESCRIPTION OF EMBODIMENTS

Below, the embodiments of the present invention will be described further in detail in conjunction with figures and examples, which are provided for explaining the present invention, instead of limiting the protection scope of the present invention.

In the present embodiment, the heat source comprises solar energy, air, rivers, oceans, underground heat, desert or other natural thermal energy, and also includes thermal energy, afterheat, waste heat produced in industrial and agricultural fields and other fields, and also includes thermal energy, afterheat, and waste heat generated during human life.

Figure 1:
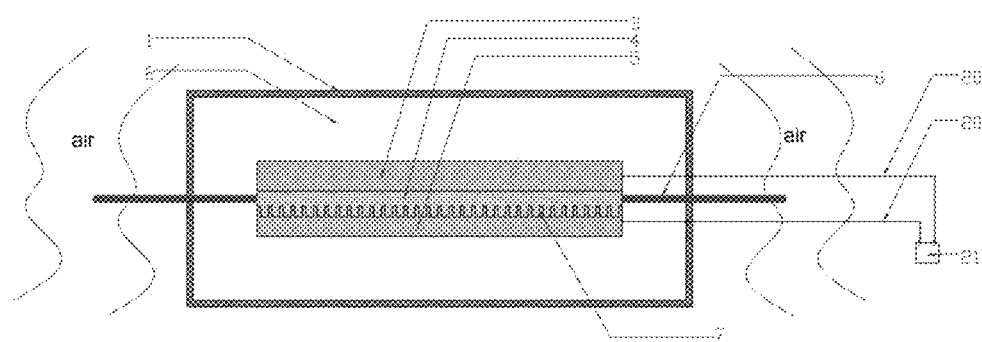
FIG. 1 is a schematic view of a single-board natural thermal energy superconductor power generation device according to an embodiment of the present invention.

FIG. 1 is a schematic view of a single-board natural thermal energy superconductor power generation device according to an embodiment of the present invention, comprising a vacuum tank 1, a vacuum environment 2, a positive electrode 3, a semiconductor 4, a negative electrode 5, a superconductor heat pipe 6, a semiconductor mosaic structure 7, electrical transmission lines 20, an energy storage device 21, a capacitor or super capacitor 22, a protection circuit 23, a flywheel 24, and a storage battery 25. Here, the vacuum tank 1 is at the outermost layer of the whole device to form an enclosed tank, for fixing and supporting internal devices and technically supporting the internal vacuum environment 2, and the entire space within the vacuum tank forms a vacuum environment 2. The surface-smooth and level side of the positive electrode 3 is organically tightly integrally joined with the semiconductor material 4. Alternatively, it is also possible to print the positive electrode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 μm, the height of 0.1 μm and the interval of 0.1 μm are embedded into the semiconductor material 4; (2) widely spread column structures which have the diameter of 0.1 μm, the height of 0.1 μm, and the distance of 0.1 μm are embedded (inserted) into the semiconductor material 4; (3) widely spread cavity structures which have the diameter of 0.1 μm, the depth of 0.1 μm, and the distance of 0.1 μm are embedded (inserted) into the semiconductor material 4; (4) cavity structures in a cube form with 0.1 μm multiplying 0.1 μm, the depth of 0.1 μm, and the distance of 0.1 μm are embedded (inserted) into the semiconductor material 4; (5) cavity structures in a cube form with 0.1 μm multiplying 0.1 μm, the convex height of 0.1 μm, and the distance of 0.1 μm are embedded (inserted) into the semiconductor material 4. The above value 0.1 μm is one example in the value range of the present invention, and it may be any value between 0.1 nm and 1 μm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20.

The positive electrode 3, the semiconductor material 4 and the negative electrode 5 are combined through mosaic structure 7 and the like to form the energy conversion device in the novel device of the present invention. The energy conversion device is fixed in the vacuum tank, and the space between the energy conversion device and the vacuum tank is the vacuum environment 2.

The superconductor heat pipe 6 has one end communicating with the external environment and the other end connected with the energy conversion device, so as to transfer, through the superconductor heat pipe 6, the thermal energy in the external environment to the energy conversion device, which is formed by the positive electrode 3, the semiconductor material 4, and the negative electrode 5, which are combined through a mosaic structure 7 and the like.

The operational principle of the embodiment of the present invention is: the thermal energy in the external environment is transferred through the superconductor heat pipe 6 to the energy conversion device, which is formed by the positive electrode 3, the semiconductor material 4, and the negative electrode 5, which are combined through a mosaic structure 7 and the like. After the semiconductor 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor) 22 into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 35:
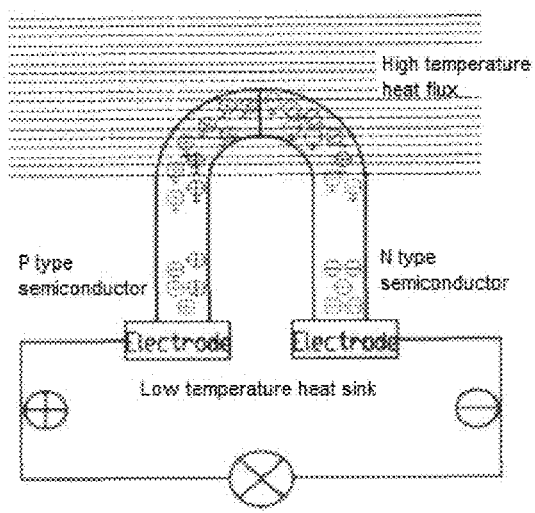
FIG. 35 is a schematic view of temperature-difference power generation.

The technical principle of the conventional semiconductor temperature-difference power generation is as follows. FIG. 35 is a schematic view of the temperature-difference power generation. This device can use the temperature difference to directly generate the electrical energy. In a P(N)-semiconductor, since the thermal excitation has stronger effect, the concentration of the holes (electrons) is larger on the high temperature end than the low temperature end. By the driving of such concentration gradient, the holes (electrons), due to the thermal diffusion action, would diffuse from the high temperature end toward the low temperature end, so as to form an electric potential difference, which is the principle of the temperature-difference power generation. To meet the requirements of this power generation technology, it is necessary to have a P(N)-semiconductor structure and fixed high and low temperature ends (i.e., a temperature gradient from a high temperature to a low temperature), which are regarded as limitations among others. Moreover, the current researches on the temperature-difference power generation technology mostly use low-level thermal energy, such as the geothermal energy, solar energy, ocean energy and so on, which are higher than the environment temperature. Thus, the above temperature gradient (the temperature gradients in the natural environment) can not be used for the absorption conduction conversion.

After obtaining the temperature gradient, the question is how to more effectively carry out the temperature-difference power generation (thermoelectrical conversion). However, in this aspect, the existing temperature-difference power generation devices can not achieve this target, since the materials used currently are mainly doped semiconductor material, i.e., P(N)-semiconductor. The semiconductor, after being processed by the doping technology, will increase the number of the internal carriers, and at the same time, decrease its electrical resistance. However, these changes are limited. The number of the internal carriers is 20% of that of a conductor at most. With such construction, only less than 20% of the electron-hole pairs produced by the thermal excitation are made to be separated. Therefore, the thermal electrical conversion only can reach 5-10% and it also needs to separate the electron-hole pairs produced by the semiconductor undergoing the thermal excitation. While the novel and inventive technology of the present invention found a breakthrough at this aspect, that is, the semiconductor 4 undergoes the thermal excitation to produce electron-hole pairs, and the separated free electrons directionally enter the cathode material 5 of the novel device of the present invention directly under the effect of the electrostatic field, such that the separation of the electron-hole pairs is no longer affected by the carrier density of the semiconductor 4, the affections including an extreme low temperature, an extreme small temperature difference, a temperature difference having directional change, and so on. A small temperature difference is enough to highly effectively, quickly, significantly perform the capturing, absorption, and conversion to the electrical energy. Therefore, using the novel technology of the present invention, the thermal electrical conversion can reach more than 50%, and the current density can reach more than 900 A/cm$^2$. With further development of this technology, the thermal electrical conversion can reach more than 90%, and the current density can reach more than 1000 A/cm$^2$.

The mosaic structure figures, FIGS. 1-5, may be referred to, for the mosaic structure between the semiconductor 4 and the negative electrode 5.

Figure 2:
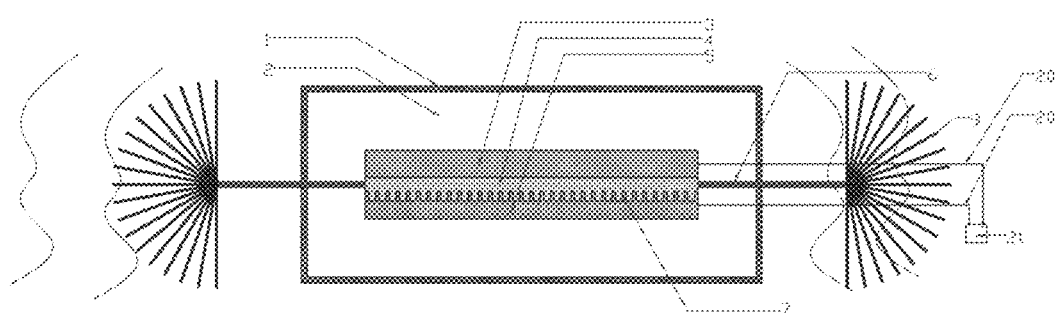
FIG. 2 is a schematic view of a single-board natural thermal energy superconductor power generation device according to an embodiment of the present invention.

FIG. 2 is a schematic view of a single-board natural thermal energy superconductor power generation device according to an embodiment of the present invention, comprising a vacuum tank 1, a vacuum environment 2, a positive electrode 3, a semiconductor 4, a negative electrode 5, a superconductor heat pipe 6, a semiconductor mosaic structure 7, an energy absorption and extension device 9, an electrical transmission line 20, an energy storage device 2, a capacitor (super capacitor) 22, a protection circuit 23, a flywheel 24, and an energy storage battery 25, wherein the vacuum tank 1 is at the outermost layer of the whole device to form an enclosed tank, which is configured to fix and support internal devices and technically support the internal vacuum environment 2, and the entire space within the vacuum tank forms the vacuum environment 2; one surface-smooth and level side of the positive electrode 3 is tightly organically integrally joined with the semiconductor material 4. It is also possible to print the positive electrode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 µm, the height of 0.1 µm and the interval of 0.1 µm are embedded into the semiconductor material 4; (2) widely spread column structures which have the diameter of 0.1 µm, the height of 0.1 µm, and the distance of 0.1 µm are embedded (inserted) into the semiconductor material 4; (3) widely spread cavity structures which have the diameter of 0.1 µm, the depth of 0.1 µm, and the distance of 0.1 µm are embedded (inserted) into the semiconductor material 4; (4) cavity structures in a cube form with 0.1 µm multiplying 0.1 µm, the depth of 0.1 µm, and the distance of 0.1 µm are embedded (inserted) into the semiconductor material 4; (5) cavity structures in a cube form with 0.1 µm multiplying 0.1 µm, the convex height of 0.1 µm, and the distance of 0.1 µm are embedded (inserted) into the semiconductor material 4. The above value 0.1 µm is one example in the value range of the present invention, and it may be any value between 0.1 nm and 1 µm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20 as well.

The energy conversion device in the novel device of the present invention is formed by combining the positive electrode 3, the semiconductor material 4, and the negative electrode 5 through the mosaic structure 7 and so on. The energy conversion device is fixed in the vacuum tank, and the space between the energy conversion device and the vacuum tank forms the vacuum environment 2.

The superconductor heat pipe 6 has one end connected with the energy absorption and extension device 9 that communicates to the external environment and the other end connected with the energy conversion device so as to transfer, through the superconductor heat pipe 6, the thermal energy in the external environment to the energy conversion device which is composed of a positive electrode 3, semiconductor material 4, a negative electrode 5 combined through the mosaic structure 7 and so on. Here, the energy absorption and extension device 9, which uses the thermal energy around the power generation device with the radio-activity characteristics, collects the thermal energy around the power generation device (solar energy, air, rivers, oceans, underground heat, desert and the like) for a large scale, and then transfers it to the heating end of the heat pipe or superconductor heat pipe 6. Therefore, the thermal energy is transferred to the energy conversion device, which converts the thermal energy into the electrical energy.

The operational principle of the embodiment of the present invention is as follows. The thermal energy in the external environment, i.e., the thermal energy around the power generation device (solar energy, air, rivers, oceans, underground heat, desert and the like), are quickly collected by the energy absorption and extension device 9 for a large scale, and then it is transferred to the superconductor heat pipe 6 connected to the energy absorption and extension device 9, and the thermal energy is transferred to the energy conversion device formed by combining the positive electrode 3, the semiconductor material 4, and the negative electrode 5 through the mosaic structure 7 and the like. After the semiconductor material 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor) 22 into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 3:
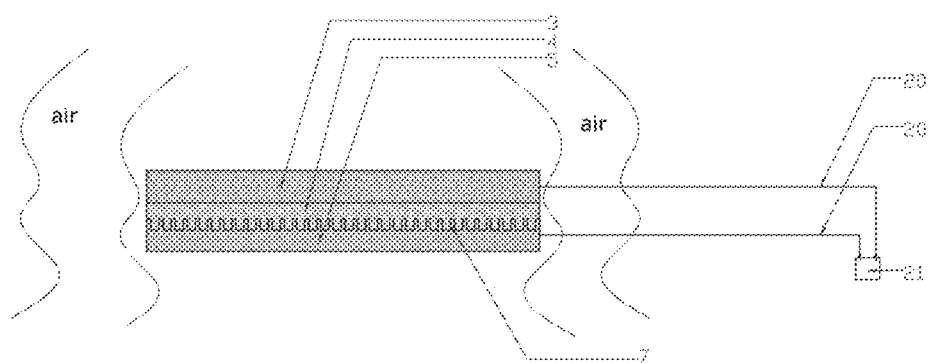
FIG. 3 is a schematic view of a single-board natural thermal energy power generation device according to an embodiment of the present invention.

FIG. 3 is a schematic view of a single-board natural thermal energy power generation device according to an embodiment of the present invention.

It comprises a positive electrode 3, a semiconductor 4, a negative electrode 5, a semiconductor mosaic structure 7, an electrical transmission line 20, an energy storage device 21, a capacitor (super capacitor) 22, a protection circuit 23, a flywheel 24, a storage battery 25, wherein one surface-smooth and level side of the positive electrode 3 is tightly organically integrally joined with the semiconductor material 4. It is also possible to print the positive electrode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 μm, the height of 0.1 μm and the interval of 0.1 μm are embedded into the semiconductor material 4; (2) widely spread column structures which have the diameter of 0.1 μm, the height of 0.1 μm, and the distance of 0.1 μm are embedded (inserted) into the semiconductor material 4; (3) widely spread cavity structures which have the diameter of 0.1 μm, the depth of 0.1 μm, and the distance of 0.1 μm are embedded (inserted) into the semiconductor material 4; (4) cavity structures in a cube form with 0.1 μm multiplying 0.1 μm, the depth of 0.1 μm, and the distance of 0.1 μm are embedded (inserted) into the semiconductor material 4; (5) cavity structures in a cube form with 0.1 μm multiplying 0.1 μm, the convex height of 0.1 μm, and the distance of 0.1 μm are embedded (inserted) into the semiconductor material 4. The above value 0.1 μm is one example in the value range of the present invention, and it may be any value between 0.1 nm and 1 μm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20 as well.

The energy conversion device in the novel device of the present invention is formed by the positive electrode 3, the semiconductor material 4, and the negative electrode 5, which are combined through a mosaic structure 7 and the like. The energy conversion device is exposed to the external environment.

The thermal energy in the external environment is transmitted, by means of free diffusion, to the energy conversion device formed by the positive electrode 3, the semiconductor material 4, and the negative electrode 5, which are combined through a mosaic structure 7 and the like.

The operational principle of the embodiment of the present invention is as follows. The thermal energy in the external environment is transmitted, by means of free diffusion, to the energy conversion device formed by the positive electrode 3, the semiconductor material 4, and the negative electrode 5, which are combined through a mosaic structure 7 and the like. After the semiconductor material 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, has one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 4:
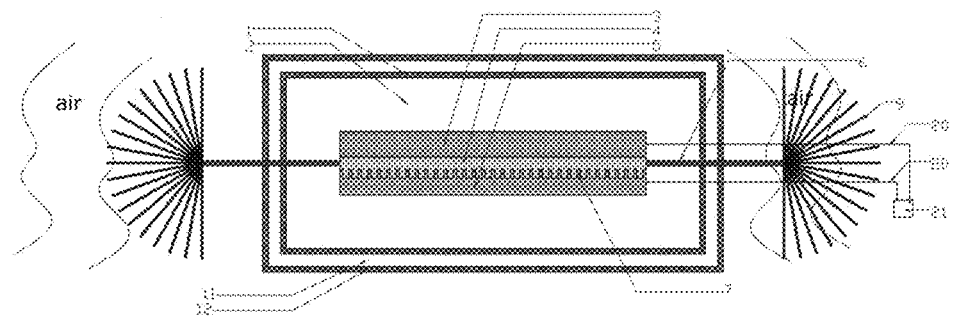
FIG. 4 is a schematic view of a single-board natural thermal energy superconductor power generation device according to an embodiment of the present invention.

FIG. 4 is a schematic view of a single-board natural thermal energy superconductor power generation device according to an embodiment of the present invention, which comprises a vacuum tank 1, a vacuum environment 2, a positive electrode 3, a semiconductor 4, a negative electrode 5, a superconductor heat pipe 6, a semiconductor mosaic structure 7, an energy absorption and extension device 9, a refrigeration environment 11, a refrigeration device 12, electrical transmission lines 20, an energy storage device 21, a capacitor (super capacitor) 22, a protection circuit 23, a flywheel 24, and a storage battery 25. Here, the refrigeration device 12 is located outside of the vacuum tank 1, and the refrigeration environment 11 is formed between the refrigeration device and the vacuum tank 1. The refrigeration environment 11 can make the temperature difference sustain for significantly long time. The energy conversion device is kept in the low temperature environment, such that the condition for the energy conversion is more obvious and the range of the temperature difference is enlarged. The vacuum tank 1 is an enclosed tank, which is configured to fix and support internal devices and technically support the internal vacuum environment 2, and the entire space within the vacuum tank 1 forms the vacuum environment 2. The surface-smooth and level side of the positive electrode 3 is tightly organically integrally joined with the semiconductor material 4. It is also possible to print the positive electrode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 μm, the height of 0.1 μm and the interval of 0.1 μm are embedded into the semiconductor material 4; (2) widely spread column structures which have the diameter of 0.1 μm, the height of 0.1 μm, and the distance of 0.1 μm are embedded (inserted) into the semiconductor material 4; (3) widely spread cavity structures which have the diameter of 0.1 μm, the depth of 0.1 μm, and the distance of 0.1 μm are embedded (inserted) into the semiconductor material 4; (4) cavity structures in a cube form with 0.1 μm multiplying 0.1 μm, the depth of 0.1 μm, and the distance of 0.1 μm are embedded (inserted) into the semiconductor material 4; (5) cavity structures in a cube form with 0.1 μm multiplying 0.1 μm, the convex height of 0.1 μm, and the distance of 0.1 μm are embedded (inserted) into the semiconductor material 4. The above value 0.1 μm is one example in the value range of the present invention, and it may be any value between 0.1 nm and 1 μm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20 as well.

The energy conversion device in the novel device of the present invention is formed by combining the positive electrode 3, the semiconductor material 4, and the negative electrode 5 through the mosaic structure 7 and so on. The energy conversion device is fixed in the vacuum tank, and the space between the energy conversion device and the vacuum tank forms the vacuum environment 2.

The superconductor heat pipe 6 has one end connected with the energy absorption and extension device 9 that communicates to the external environment and the other end connected with the energy conversion device so as to transfer, through the superconductor heat pipe 6, the thermal energy in the external environment to the energy conversion device which is composed of a positive electrode 3, semiconductor material 4, a negative electrode 5 combined through the mosaic structure 7 and so on. Here, the energy absorption and extension device 9, which uses the thermal energy around the power generation device with the radioactivity characteristics, collects the thermal energy around the power generation device (solar energy, air, rivers, oceans, underground heat, desert and the like) for a large scale, and then transfers it to the (heated) heating end of the heat pipe or superconductor heat pipe 6. Therefore, the thermal energy is transferred to the energy conversion device, which converts the thermal energy into the electrical energy.

The operational principle of the embodiment of the present invention is as follows. The thermal energy in the external environment, i.e., the thermal energy around the power generation device (solar energy, air, rivers, oceans, underground heat, desert and the like), are quickly collected by the energy absorption and extension device 9 for a large scale, and then it is transferred to the superconductor heat pipe 6 connected to the energy absorption and extension device 9, and the thermal energy is transferred to the energy conversion device formed by combining the positive electrode 3, the semiconductor material 4, and the negative electrode 5 through the mosaic structure 7 and the like. After the semiconductor material 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 5:
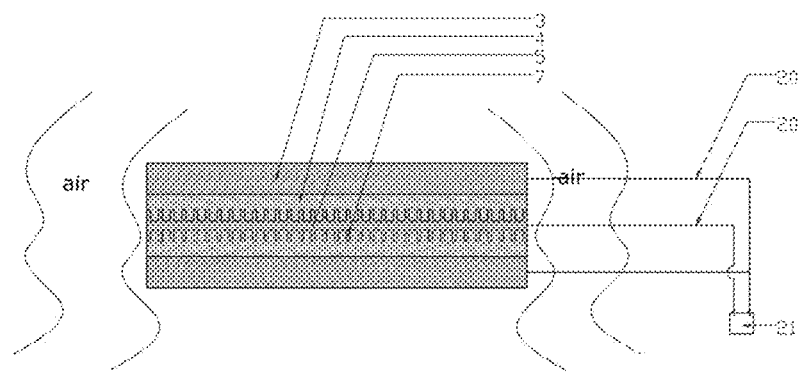
FIG. 5 is a schematic view in conformity with a double-board natural thermal energy superconductor power generation device according to an embodiment of the present invention.

FIG. 5 is a schematic view in conformity with a double-board natural thermal energy superconductor power generation device according to an embodiment of the present invention, comprising a positive electrode 3, a semiconductor 4, a negative electrode 5, a semiconductor mosaic structure 7, electrical transmission lines 20, an energy storage device 21, a capacitor (super capacitor) 22, a protection circuit 23, a flywheel 24, and a storage battery 25. Here, the surface-smooth and level side of the positive electrode 3 is tightly organically integrally joined with the semiconductor material 4. It is also possible to print the positive electrode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 μm, the height of 0.1 μm and the interval of 0.1 μm are embedded into the semiconductor material 4; (2) widely spread column structures which have the diameter of 0.1 μm, the height of 0.1 μm, and the distance of 0.1 μm are embedded (inserted) into the semiconductor material 4; (3) widely spread cavity structures which have the diameter of 0.1 μm, the depth of 0.1 μm, and the distance of 0.1 μm are embedded (inserted) into the semiconductor material 4; (4) cavity structures in a cube form with 0.1 μm multiplying 0.1 μm, the depth of 0.1 μm, and the distance of 0.1 μm are embedded (inserted) into the semiconductor material 4; (5) cavity structures in a cube form with 0.1 μm multiplying 0.1 μm, the convex height of 0.1 μm, and the distance of 0.1 μm are embedded (inserted) into the semiconductor material 4. The above value 0.1 μm is one example in the value range of the present invention, and it may be any value between 0.1 nm and 1 μm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20 as well.

The positive electrode 3, the semiconductor material 4, and the negative electrode 5 are combined through the mosaic structure 7 and so on, to form a unit structure of the energy conversion device in the novel device of the present invention, and then two layers of the unit structures are arranged sequentially to form the energy conversion device, which is exposed to the external environment.

The thermal energy in the external environment is transmitted, by means of free diffusion, to the energy conversion device formed by the positive electrode 3, the semiconductor material 4, and the negative electrode 5, which are combined through a mosaic structure 7 and the like.

The operational principle of the embodiment of the present invention is: the thermal energy in the external environment is transferred, by means of the free diffusion, to the energy conversion device, which is formed by the positive electrode 3, the semiconductor material 4, and the negative electrode 5, which are combined through a mosaic structure 7 and the like. After the semiconductor 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 6:
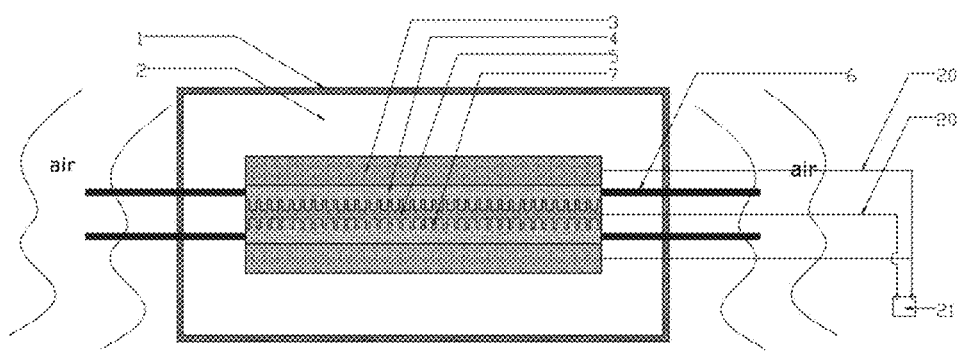
FIG. 6 is a schematic view in conformity with a double-board natural thermal energy superconductor heat pipe power generation device according to an embodiment of the present invention.

FIG. 6 is a schematic view in conformity with a double-board natural thermal energy superconductor heat pipe power generation device according to an embodiment of the present invention. The embodiment of the present invention comprises a vacuum tank 1, a vacuum environment 2, a positive electrode 3, a semiconductor 4, a negative electrode 5, a superconductor heat pipe 6, a semiconductor mosaic structure 7, electrical transmission lines 20, an energy storage device 21, a capacitor (super capacitor) 22, a protection circuit 23, a flywheel 24, and a storage battery 25. Here, the vacuum tank 1 is at the outermost layer of the whole device to form an enclosed tank, for fixing and supporting internal devices and technically supporting the internal vacuum environment 2, and the entire space within the vacuum tank forms a vacuum environment 2. The surface-smooth and level side of the positive electrode 3 is organically tightly integrally joined with the semiconductor material 4. Alternatively, it is also possible to print the positive electrode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 μm, the height of 0.1 μm and the interval of 0.1 μm are embedded into the semiconductor material 4; (2) widely spread column structures which have the diameter of 0.1 μm, the height of 0.1 μm, and the distance of 0.1 μm are embedded (inserted) into the semiconductor material 4; (3) widely spread cavity structures which have the diameter of 0.1 μm, the depth of 0.1 μm, and the distance of 0.1 μm are embedded (inserted) into the semiconductor material 4; (4) cavity structures in a cube form with 0.1 μm multiplying 0.1 μm, the depth of 0.1 μm, and the distance of 0.1 μm are embedded (inserted) into the semiconductor material 4; (5) cavity structures in a cube form with 0.1 μm multiplying 0.1 μm, the convex height of 0.1 μm, and the distance of 0.1 μm are embedded (inserted) into the semiconductor material 4. The above value 0.1 μm is one example in the value range of the present invention, and it may be any value between 0.1 nm and 1 μm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20.

The positive electrode 3, the semiconductor material 4 and the negative electrode 5 are combined through mosaic structure 7 and the like to form the unit structure of the energy conversion device in the novel device of the present invention and then two layers of the unit structures are arranged sequentially to form the energy conversion device. The energy conversion device is fixed in the vacuum tank, and the space between the energy conversion device and the vacuum tank is the vacuum environment 2.

The superconductor heat pipe 6 has one end communicating with the external environment and the other end connected with the energy conversion device, so as to transfer, through the superconductor heat pipe 6, the thermal energy in the external environment to the energy conversion device, which is formed by the positive electrode 3, the semiconductor material 4, and the negative electrode 5, which are combined through a mosaic structure 7 and the like.

The operational principle of the embodiment of the present invention is: the thermal energy in the external environment is transferred through the superconductor heat pipe 6 to the energy conversion device, which is formed by the positive electrode 3, the semiconductor material 4, and the negative electrode 5, which are combined through a mosaic structure 7 and the like. After the semiconductor material 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 7:
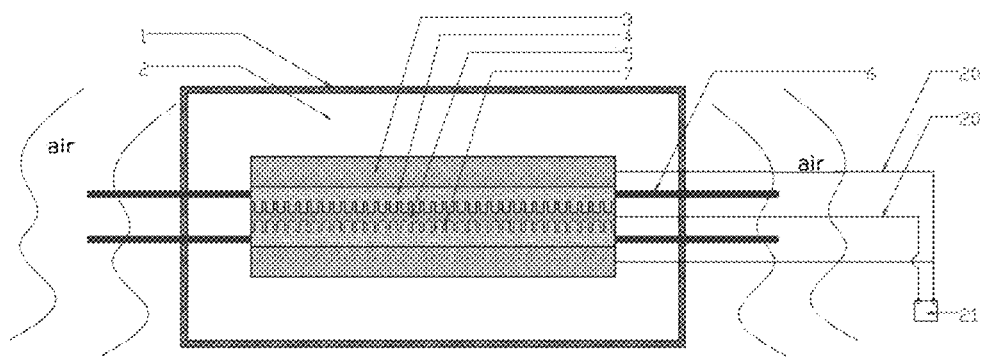
FIG. 7 is a schematic view in conformity with a double-board natural thermal energy heat pipe power generation device according to an embodiment of the present invention.

FIG. 7 is a schematic view in conformity with a double-board natural thermal energy heat pipe power generation device according to an embodiment of the present invention. The embodiment of the present invention comprises a vacuum tank 1, a vacuum environment 2, a positive electrode 3, a semiconductor 4, a negative electrode 5, a superconductor heat pipe 6, a semiconductor mosaic structure 7, electrical transmission lines 20, an energy storage device 21, a capacitor (super capacitor) 22, a protection circuit 23, a flywheel 24, and a storage battery 25. Here, the vacuum tank 1 is at the outermost layer of the whole device to form an enclosed tank, for fixing and supporting internal devices and technically supporting the internal vacuum environment 2, and the entire space within the vacuum tank forms a vacuum environment 2. The surface-smooth and level side of the positive electrode 3 is organically tightly integrally joined with the semiconductor material 4. Alternatively, it is also possible to print the anode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 μm, the height of 0.1 μm and the interval of 0.1 μm are embedded into the semiconductor material 4; (2) widely spread column structures which have the diameter of 0.1 μm, the height of 0.1 μm, and the distance of 0.1 μm are embedded (inserted) into the semiconductor material 4; (3) widely spread cavity structures which have the diameter of 0.1 μm, the depth of 0.1 μm, and the distance of 0.1 μm are embedded (inserted) into the semiconductor material 4; (4) cavity structures in a cube form with 0.1 μm multiplying 0.1 μm, the depth of 0.1 μm, and the distance of 0.1 μm are embedded (inserted) into the semiconductor material 4; (5) cavity structures in a cube form with 0.1 μm multiplying 0.1 μm, the convex height of 0.1 μm, and the distance of 0.1 μm are embedded (inserted) into the semiconductor material 4. The above value 0.1 μm is one example in the value range of the present invention, and it may be any value between 0.1 nm and 1 μm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20.

The positive electrode 3, the semiconductor material 4 and the negative electrode 5 are combined through mosaic structure 7 and the like to form the unit structure of the energy conversion device in the novel device of the present invention and then two layers of the unit structures are arranged sequentially to form the energy conversion device. The energy conversion device is fixed in the vacuum tank, and the space between the energy conversion device and the vacuum tank is the vacuum environment 2.

The superconductor heat pipe 6 has one end communicating with the external environment and the other end connected with the energy conversion device, so as to transfer, through the superconductor heat pipe 6, the thermal energy in the external environment to the energy conversion device, which is formed by the positive electrode 3, the semiconductor material 4, and the negative electrode 5, which are combined through a mosaic structure 7 and the like.

The operational principle of the embodiment of the present invention is: the thermal energy in the external environment is transferred through the heat pipe 6 to the energy conversion device, which is formed by the positive electrode 3, the semiconductor material 4, and the negative electrode 5, which are combined through a mosaic structure 7 and the like. After the semiconductor material 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 8:
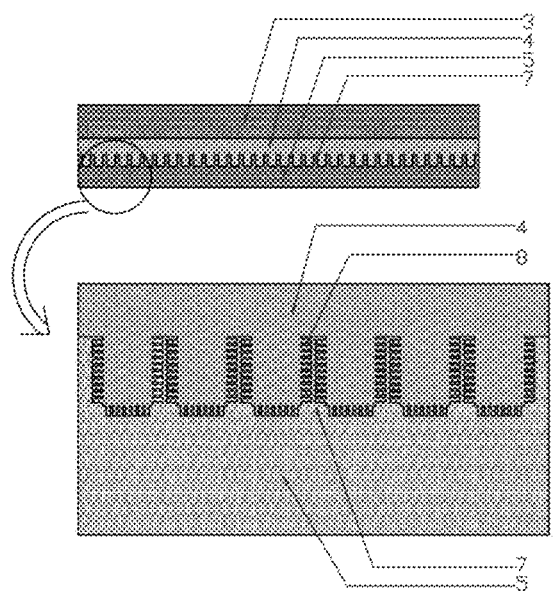
FIG. 8 is a schematic view in conformity with a mosaic structure according to an embodiment of the present invention.
Figure 9:
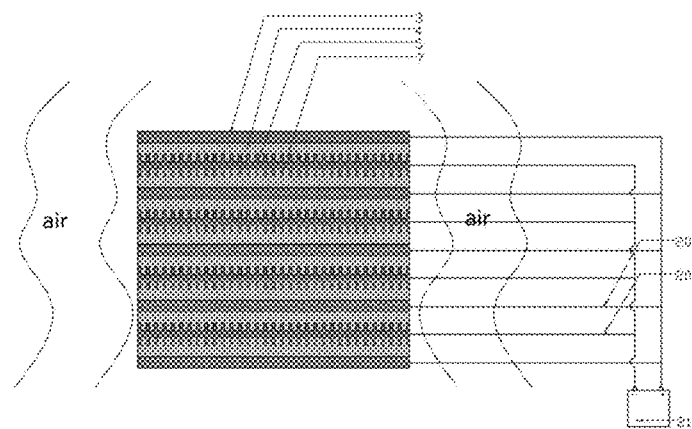
FIG. 9 is a schematic view in conformity with a multiple-board natural thermal energy power generation device according to an embodiment of the present invention.

FIG. 8 is a schematic view in conformity with a mosaic structure according to an embodiment of the present invention; and FIG. 9 is a schematic view in conformity with a multiple-board natural thermal energy power generation device according to an embodiment of the present invention. The embodiment of the present invention comprises a positive electrode 3, a semiconductor 4, a negative electrode 5, a semiconductor mosaic structure 7, electrical transmission lines 20, an energy storage device 21, a capacitor (super capacitor) 22, a protection circuit 23, a flywheel 24, and a storage battery 25. Here, the surface-smooth and level side of the positive electrode 3 is organically tightly integrally joined with the semiconductor material 4. Alternatively, it is also possible to print the anode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 μm, the height of 0.1 μm and the interval of 0.1 μm are embedded into the semiconductor material 4; (2) widely spread column structures which have the diameter of 0.1 μm, the height of 0.1 μm, and the distance of 0.1 μm are embedded (inserted) into the semiconductor material 4; (3) widely spread cavity structures which have the diameter of 0.1 μm, the depth of 0.1 μm, and the distance of 0.1 μm are embedded (inserted) into the semiconductor material 4; (4) cavity structures in a cube form with 0.1 μm multiplying 0.1 μm, the depth of 0.1 μm, and the distance of 0.1 μm are embedded (inserted) into the semiconductor material 4; (5) cavity structures in a cube form with 0.1 μm multiplying 0.1 μm, the convex height of 0.1 μm, and the distance of 0.1 μm are embedded (inserted) into the semiconductor material 4. The above value 0.1 μm is one example in the value range of the present invention, and it may be any value between 0.1 nm and 1 μm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20.

The positive electrode 3, the semiconductor material 4 and the negative electrode 5 are combined through mosaic structure 7 and the like to form the unit structure of the energy conversion device in the novel device of the present invention and then multiple layers of the unit structures are arranged sequentially to form the energy conversion device. The energy conversion device is exposed to the external environment.

The thermal energy in the external environment is transmitted, through the free diffusion, to the energy conversion device formed by the multiple layers of the unit structures are arranged in order, with the unit structure composed of the positive electrode 3, the semiconductor material 4 and the negative electrode 5 combined through mosaic structure 7 and the like.

The operational principle of the embodiment of the present invention is: the thermal energy in the external environment is transferred, by means of the free diffusion, to the energy conversion device formed by the multiple layers of the unit structures are arranged in order, with the unit structure composed of the positive electrode 3, the semiconductor material 4 and the negative electrode 5 combined through mosaic structure 7 and the like. After the semiconductor 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 10:
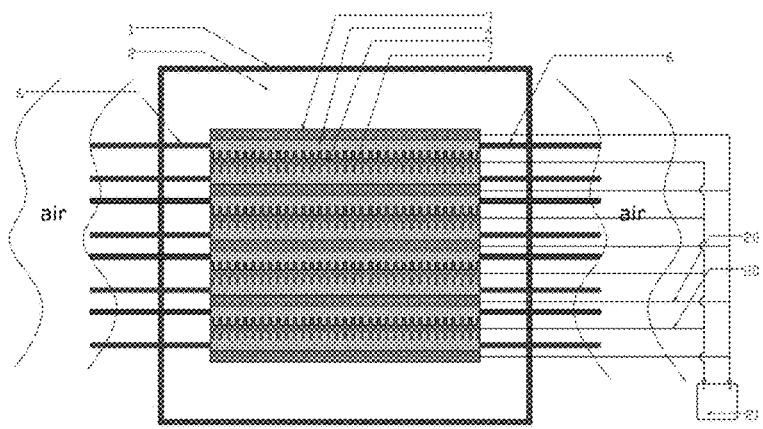
FIG. 10 is a schematic view in conformity with a multiple-board natural thermal energy heat pipe power generation device according to an embodiment of the present invention.

FIG. 10 is a schematic view in conformity with a multiple-board natural thermal energy heat pipe power generation device according to an embodiment of the present invention.

The embodiment of the present invention comprises a vacuum tank 1, a vacuum environment 2, a positive electrode 3, a semiconductor 4, a negative electrode 5, a superconductor heat pipe 6, a semiconductor mosaic structure 7, electrical transmission lines 20, an energy storage device 21, a capacitor (super capacitor) 22, a protection circuit 23, a flywheel 24, and a storage battery 25. Here, the vacuum tank 1 is at the outermost layer of the whole device to form an enclosed tank, for fixing and supporting internal devices and technically supporting the internal vacuum environment 2, and the entire space within the vacuum tank forms a vacuum environment 2. The surface-smooth and level side of the positive electrode 3 is organically tightly integrally joined with the semiconductor material 4. Alternatively, it is also possible to print the positive electrode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 µm, the height of 0.1 µm and the interval of 0.1 µm are embedded into the semiconductor material 4; (2) widely spread column structures which have the diameter of 0.1 µm, the height of 0.1 µm, and the distance of 0.1 µm are embedded (inserted) into the semiconductor material 4; (3) widely spread cavity structures which have the diameter of 0.1 µm, the depth of 0.1 µm, and the distance of 0.1 µm are embedded (inserted) into the semiconductor material 4; (4) cavity structures in a cube form with 0.1 µm multiplying 0.1 µm, the depth of 0.1 µm, and the distance of 0.1 µm are embedded (inserted) into the semiconductor material 4; (5) cavity structures in a cube form with 0.1 µm multiplying 0.1 µm, the convex height of 0.1 µm, and the distance of 0.1 µm are embedded (inserted) into the semiconductor material 4. The above value 0.1 µm is one example in the value range of the present invention, and it may be any value between 0.1 nm and 1 µm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20.

The positive electrode 3, the semiconductor material 4 and the negative electrode 5 are combined through mosaic structure 7 and the like to form the unit structure of the energy conversion device in the novel device of the present invention, and then multiple layers of the unit structures are arranged sequentially to form the energy conversion device. The energy conversion device is fixed in the vacuum tank, and the space between the energy conversion device and the vacuum tank is the vacuum environment 2.

The heat pipe 6 has one end communicating with the external environment and the other end connected with the energy conversion device, so as to transfer, through the heat pipe 6, the thermal energy in the external environment to the energy conversion device, which is formed by the positive electrode 3, the semiconductor material 4, and the negative electrode 5, which are combined through a mosaic structure 7 and the like.

The operational principle of the embodiment of the present invention is: the thermal energy in the external environment is transferred, by means of the heat pipe 6, to the energy conversion device formed by the positive electrode 3, the semiconductor material 4 and the negative electrode 5 combined through mosaic structure 7 and the like. After the semiconductor material 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor) 22 into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 11:
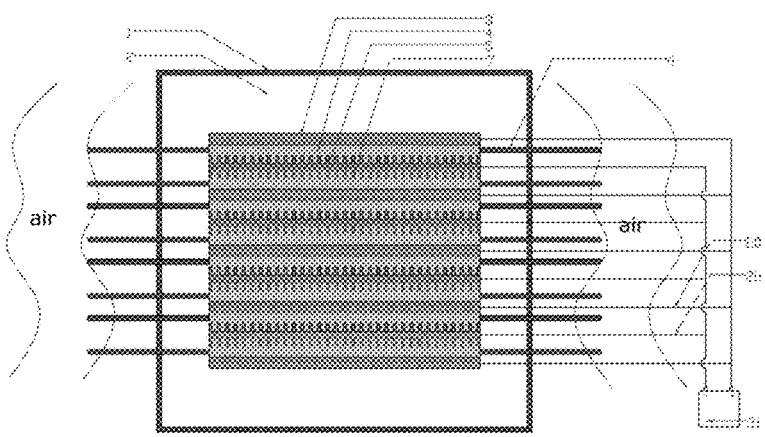
FIG. 11 is a schematic view in conformity with a multiple-board natural thermal energy superconductor heat pipe power generation device according to an embodiment of the present invention.

FIG. 11 is a schematic view in conformity with a multiple-board natural thermal energy superconductor heat pipe power generation device according to an embodiment of the present invention.

The embodiment of the present invention comprises a vacuum tank 1, a vacuum environment 2, a positive electrode 3, a semiconductor 4, a negative electrode 5, a superconductor heat pipe 6, a semiconductor mosaic structure 7, electrical transmission lines 20, an energy storage device 21, a capacitor or super capacitor 22, a protection circuit 23, a flywheel 24, and a storage battery 25. Here, the vacuum tank 1 is at the outermost layer of the whole device to form an enclosed tank, for fixing and supporting internal devices and technically supporting the internal vacuum environment 2, and the entire space within the vacuum tank forms a vacuum environment 2. The surface-smooth and level side of the positive electrode 3 is organically tightly integrally joined with the semiconductor material 4. Alternatively, it is also possible to print the positive electrode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 μm, the height of 0.1 μm and the interval of 0.1 μm are embedded into the semiconductor material 4; (2) widely spread column structures which have the diameter of 0.1 μm, the height of 0.1 μm, and the distance of 0.1 μm are embedded (inserted) into the semiconductor material 4; (3) widely spread cavity structures which have the diameter of 0.1 μm, the depth of 0.1 μm, and the distance of 0.1 μm are embedded (inserted) into the semiconductor material 4; (4) cavity structures in a cube form with 0.1 μm multiplying 0.1 μm, the depth of 0.1 μm, and the distance of 0.1 μm are embedded (inserted) into the semiconductor material 4; (5) cavity structures in a cube form with 0.1 μm multiplying 0.1 μm, the convex height of 0.1 μm, and the distance of 0.1 μm are embedded (inserted) into the semiconductor material 4. The above value 0.1 μm is one example in the value range of the present invention, and it may be any value between 0.1 nm and 1 μm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20.

The positive electrode 3, the semiconductor material 4, and the negative electrode 5 are combined through the mosaic structure 7 and so on, to form a unit structure of the energy conversion device in the novel device of the present invention, and then multiple layers of the unit structures are arranged sequentially to form the energy conversion device. The energy conversion device is fixed in the vacuum tank, and the space between the energy conversion device and the vacuum tank is the vacuum environment 2.

The superconductor heat pipe 6 has one end communicating with the external environment and the other end connected with the energy conversion device, so as to transfer, through the superconductor heat pipe 6, the thermal energy in the external environment to the energy conversion device, which is formed by the positive electrode 3, the semiconductor material 4, and the negative electrode 5, which are combined through a mosaic structure 7 and the like.

The operational principle of the embodiment of the present invention is: the thermal energy in the external environment is transferred through the superconductor heat pipe 6 to the energy conversion device, which is formed by the positive electrode 3, the semiconductor material 4, and the negative electrode 5, which are combined through a mosaic structure 7 and the like. After the semiconductor material 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 12:
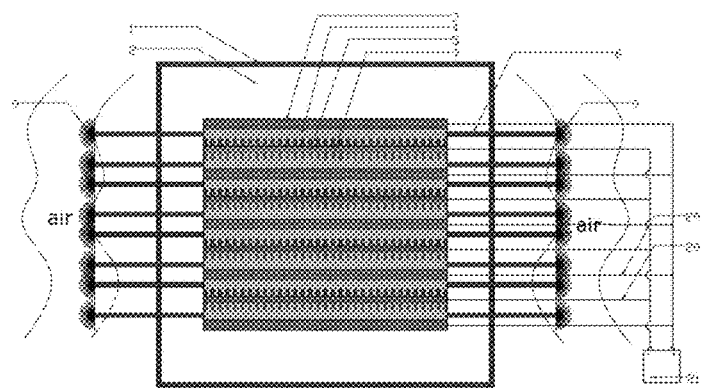
FIG. 12 is a schematic view in conformity with a multiple-board natural thermal energy superconductor heat pipe power generation device according to an embodiment of the present invention.

FIG. 12 is a schematic view in conformity with a multiple-board natural thermal energy superconductor heat pipe power generation device according to an embodiment of the present invention.

The embodiment of the present invention comprises a vacuum tank 1, a vacuum environment 2, a positive electrode 3, a semiconductor 4, a negative electrode 5, a superconductor heat pipe 6, a semiconductor mosaic structure 7, an energy absorption and extension device 9, electrical transmission lines 20, an energy storage device 21, a capacitor or super capacitor 22, a protection circuit 23, a flywheel 24, and a storage battery 25. Here, the vacuum tank 1 is at the outermost layer of the whole device to form an enclosed tank, for fixing and supporting internal devices and technically supporting the internal vacuum environment 2, and the entire space within the vacuum tank forms the vacuum environment 2. The surface-smooth and level side of the positive electrode 3 is organically tightly integrally joined with the semiconductor material 4. Alternatively, it is also possible to print the positive electrode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 µm, the height of 0.1 µm and the interval of 0.1 µm are embedded into the semiconductor material 4; (2) widely spread column structures which have the diameter of 0.1 µm, the height of 0.1 µm, and the distance of 0.1 µm are embedded (inserted) into the semiconductor material 4; (3) widely spread cavity structures which have the diameter of 0.1 µm, the depth of 0.1 µm, and the distance of 0.1 µm are embedded (inserted) into the semiconductor material 4; (4) cavity structures in a cube form with 0.1 µm multiplying 0.1 µm, the depth of 0.1 µm, and the distance of 0.1 µm are embedded (inserted) into the semiconductor material 4; (5) cavity structures in a cube form with 0.1 µm multiplying 0.1 µm, the convex height of 0.1 µm, and the distance of 0.1 µm are embedded (inserted) into the semiconductor material 4. The above value 0.1 µm is one example in the value range of the present invention, and it may be any value between 0.1 nm and 1 µm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20.

The positive electrode 3, the semiconductor material 4, and the negative electrode 5 are combined through the mosaic structure 7 and so on, to form a unit structure of the energy conversion device in the novel device of the present invention, and then multiple layers of the unit structures are arranged sequentially to form the energy conversion device. The energy conversion device is fixed in the vacuum tank, and the space between the energy conversion device and the vacuum tank is the vacuum environment 2.

The superconductor heat pipe 6 has one end connected with the energy absorption and extension device 9, which is connected to the external environment, and the other end connected with the energy conversion device, so as to transfer, through the superconductor heat pipe 6, the thermal energy in the external environment to the energy conversion device, which is formed by the positive electrode 3, the semiconductor material 4, and the negative electrode 5, which are combined through a mosaic structure 7 and the like. Here, the energy absorption and extension device 9, which uses the thermal energy around the power generation device with the radioactivity characteristics, collects the thermal energy around the power generation device (solar energy, air, rivers, oceans, underground heat, desert and the like) for a large scale, and then transfers it to the heating end of the heat pipe or superconductor heat pipe 6. Therefore, the thermal energy is transferred to the energy conversion device, which converts the thermal energy into the electrical energy.

Figure 13:
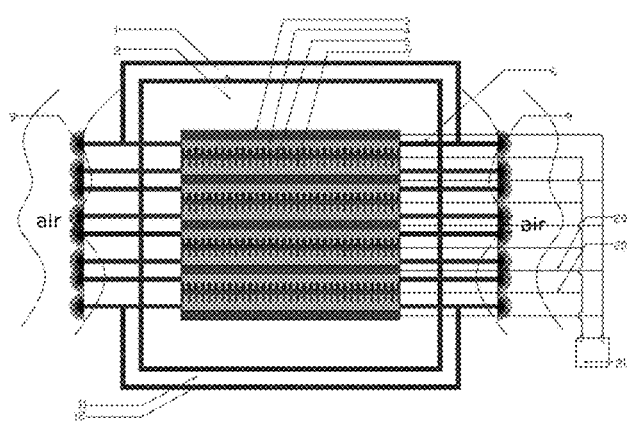
FIG. 13 is a schematic view in conformity with a multiple-board natural thermal energy superconductor heat pipe power generation device according to an embodiment of the present invention.

The operational principle of the embodiment of the present invention is as follows. The thermal energy in the external environment, i.e., the thermal energy around the power generation device (solar energy, air, rivers, oceans, underground heat, desert and the like), are quickly collected by the energy absorption and extension device 9 for a large scale, and then it is transferred to the superconductor heat pipe 6 connected to the energy absorption and extension device 9, and the thermal energy is transferred to the energy conversion device formed by combining the positive electrode 3, the semiconductor material 4, and the negative electrode 5 through the mosaic structure 7 and the like. After the semiconductor material 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like FIG. 13 is a schematic view in conformity with a multiple-board natural thermal energy superconductor heat pipe power generation device according to an embodiment of the present invention. The embodiment of the present invention comprises a vacuum tank 1, a vacuum environment 2, a positive electrode 3, a semiconductor 4, a negative electrode 5, a superconductor heat pipe 6, a semiconductor mosaic structure 7, an energy absorption and extension device 9, a refrigeration environment 11, a refrigeration device 12, electrical transmission lines 20, an energy storage device 21, a capacitor (super capacitor) 22, a protection circuit 23, a flywheel 24, and a storage battery 25. Here, the refrigeration device 12 is located outside of the vacuum tank 1, and the refrigeration environment 11 is formed between the refrigeration device and the vacuum tank 1. The refrigeration environment 11 can make the temperature difference sustain for significantly long time. The energy conversion device is kept in the low temperature environment, such that the condition for the energy conversion is more obvious and the range of the temperature difference is enlarged. The vacuum tank 1 is an enclosed tank, which is configured to fix and support internal devices and technically support the internal vacuum environment 2, and the entire space within the vacuum tank 1 forms the vacuum environment 2. The surface-smooth and level side of the positive electrode 3 is tightly organically integrally joined with the semiconductor material 4. It is also possible to print the positive electrode 3 by means of a printing technology onto one side of the semiconductor material 4, which is smoother than the cathode 5. At the same time, the positive electrode 3 is connected with the anode of the energy storage device 21 through the electrical transmission line 20. As for one side of the cathode 5, one side of the cathode 5 is embedded into the semiconductor material 4 by means of various structures. Such mosaic structure 7 of the cathode 5 may be provided by selecting one from three forms: I. a regular form, in which five different mosaic structures 7 may be provided and selected on the basic platform of this structure: (1) convex bodies with the longitudinal or lateral width of 0.1 µm, the height of 0.1 µm and the interval of 0.1 µm are embedded into the semiconductor material 4; (2) widely spread column structures which have the diameter of 0.1 µm, the height of 0.1 µm, and the distance of 0.1 µm are embedded (inserted) into the semiconductor material 4; (3) widely spread cavity structures which have the diameter of 0.1 µm, the depth of 0.1 µm, and the distance of 0.1 µm are embedded (inserted) into the semiconductor material 4; (4) cavity structures in a cube form with 0.1 µm multiplying 0.1 µm, the depth of 0.1 µm, and the distance of 0.1 µm are embedded (inserted) into the semiconductor material 4; (5) cavity structures in a cube form with 0.1 µm multiplying 0.1 µm, the convex height of 0.1 µm, and the distance of 0.1 µm are embedded (inserted) into the semiconductor material 4. The above value 0.1 µm is one example in the value range of the present invention, and it may be any value between 0.1 nm and 1 µm. Alternatively, it is in Form II which is the organism-like small intestinal chorionic structure, namely a structure in which the small intestinal chorionic (the cathode 5) is embedded into a chyme (the semiconductor material 4). Alternatively, it is in Form III, which is an irregular form in which, for example, hairs in the head of a writing brush (the cathode 5) is immersed into water (semiconductor material 4), or cellulose (the cathode 5) is dissolved into water (semiconductor material 4), and the negative electrode 4 is connected with the cathode of the energy storage device 21 through the electrical transmission line 20 as well.

The positive electrode 3, the semiconductor material 4, and the negative electrode 5 are combined through the mosaic structure 7 and so on, to form a unit structure of the energy conversion device in the novel device of the present invention, and then multiple layers of the unit structures are arranged sequentially to form the energy conversion device. The energy conversion device is fixed in the vacuum tank, and the space between the energy conversion device and the vacuum tank is the vacuum environment 2.

The superconductor heat pipe 6 has one end connected with the energy absorption and extension device 9 that communicates to the external environment and the other end connected with the energy conversion device so as to transfer, through the superconductor heat pipe 6, the thermal energy in the external environment to the energy conversion device which is composed of a positive electrode 3, semiconductor material 4, a negative electrode 5 combined through the mosaic structure 7 and so on. Here, the energy absorption and extension device 9, which uses the thermal energy around the power generation device with the radioactivity characteristics, collects the thermal energy around the power generation device (solar energy, air, rivers, oceans, underground heat, desert and the like) for a large scale, and then transfers it to the heating(heated) end of the heat pipe or superconductor heat pipe 6. Therefore, the thermal energy is transferred to the energy conversion device, which converts the thermal energy into the electrical energy.

The operational principle of the embodiment of the present invention is as follows. The thermal energy in the external environment, i.e., the thermal energy around the power generation device (solar energy, air, rivers, oceans, underground heat, desert and the like), are quickly collected by the energy absorption and extension device 9 for a large scale, and then it is transferred to the superconductor heat pipe 6 connected to the energy absorption and extension device 9, and the thermal energy is transferred to the energy conversion device formed by combining the positive electrode 3, the semiconductor material 4, and the negative electrode 5 through the mosaic structure 7 and the like. After the semiconductor material 4 in the energy conversion device undergoes the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased. Therefore, at a certain temperature, the production and recombination of the electron-hole pairs are performed simultaneously, achieving a dynamic balance. The novel device of the present invention breaks such balance, and the electron-hole pair is no longer recombined and the electron-hole pair produced by the semiconductor 4 is separated rapidly. The electrons are collected on one side, and the holes are collected on the other side. The separated electrons and holes are collected by the positive electrode 3 and the negative electrode 5, forming electrical current, such that the thermal energy is converted into the electrical energy. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 14:
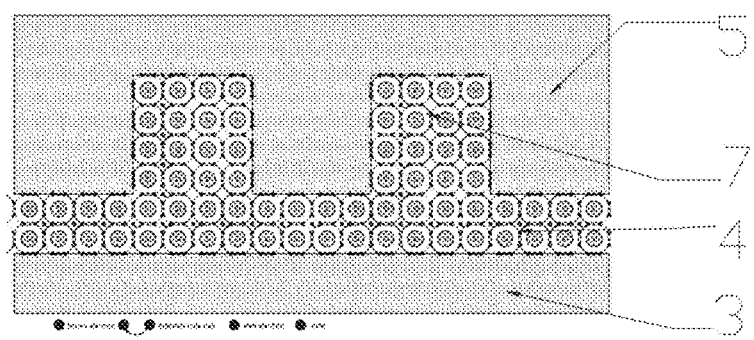
FIG. 14 is a schematic view of the model for producing electron-hole pairs in the conformity semiconductor according to an embodiment of the present invention.

FIG. 14 is a schematic view of the model for producing electron-hole pairs in the conformity semiconductor according to an embodiment of the present invention.

At an extremely low temperature, the valence band is a full band. After undergoing the thermal excitation, part of electrons in the valence band will pass over the forbidden band and enter the empty band with higher energy. The empty band becomes a conduction band after the electrons appear. The valence band, after one electron is in shortage, forms one vacancy positively charged, called a hole. The electron in the conduction band and the hole in the valence band are in combination called an electron-hole pair. At a certain temperature, the production and recombination of the electron-hole pairs are performed simultaneously, achieving a dynamic balance. At this time, the semiconductor has a certain carrier density. When the temperature increases, more electron-hole pairs are produced and the carrier density is increased.

Figure 15:
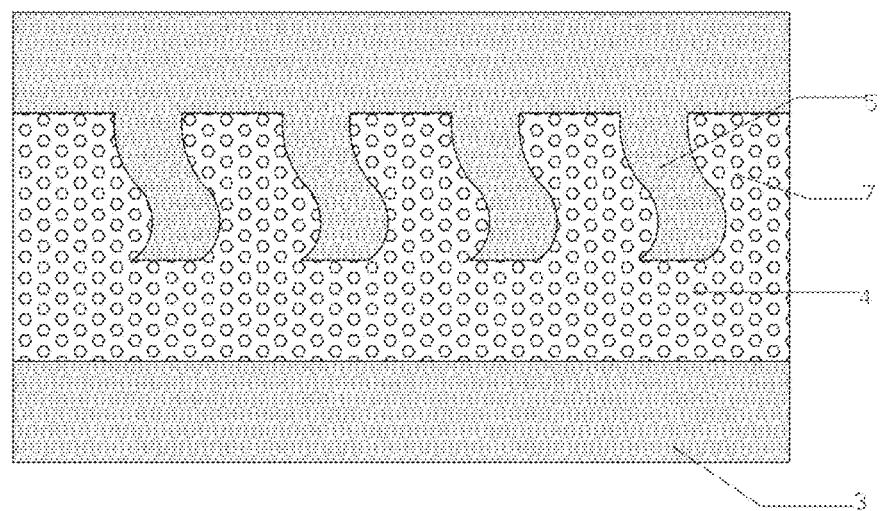
FIG. 15 is a schematic view of various mosaic structure-1 of conformity anode and cathode according to an embodiment of the present invention.

FIG. 15 is a schematic view of various mosaic structure-1 of conformity anode and cathode according to an embodiment of the present invention.

The surface-smooth and level side of the positive electrode 3 is organically tightly integrally joined with the semiconductor material 4. Alternatively, it is also possible to print the positive electrode 3 by means of a printing technology onto one side of the semiconductor material 4, which is smoother than the cathode 5. As for one side of the cathode 5, one side of the cathode 5 is embedded into the semiconductor material 4 by means of various structures.

Figure 16:
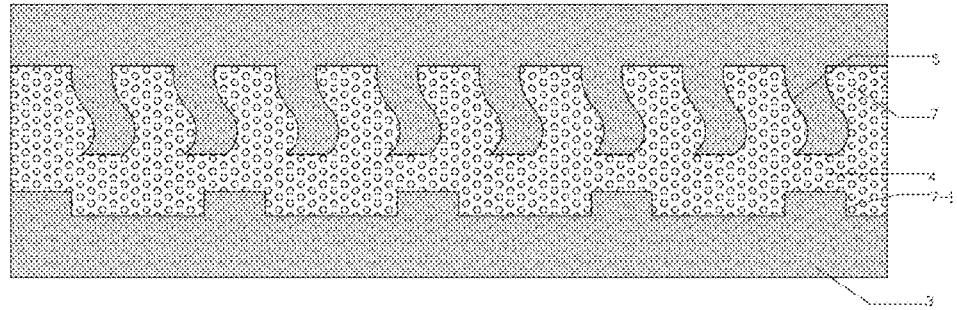
FIG. 16 is a schematic view of various mosaic structure-2 of conformity anode and cathode according to an embodiment of the present invention.

FIG. 16 is a schematic view of various mosaic structure-2 of conformity anode and cathode according to an embodiment of the present invention.

The positive electrode 3 has grooves or protrusions with a certain width on the surface, however the grooves or protrusions are larger than those on the negative electrode 5. The side of the positive electrode 3 having the grooves or protrusions of a certain width is organically tightly integrally joined with the semiconductor material 4. Alternatively, it is also possible to print the positive electrode 3 by means of a printing technology onto one side of the semiconductor material 4, which is smoother than the cathode 5. As for one side of the cathode 5, one side of the cathode 5 is embedded into the semiconductor material 4 by means of various structures.

Figure 17:
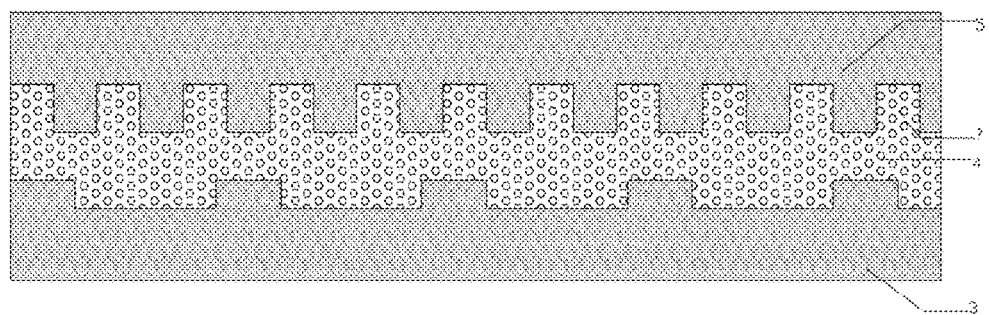
FIG. 17 is a schematic view of various mosaic structure-3 of conformity anode and cathode according to an embodiment of the present invention.

FIG. 17 is a schematic view of various mosaic structure-3 of conformity anode and cathode according to an embodiment of the present invention.

Figure 18:
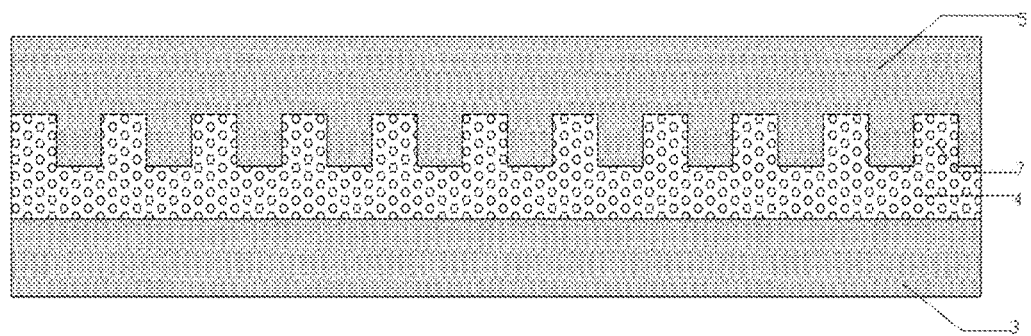
FIG. 18 is a schematic view of various mosaic structure-4 of conformity anode and cathode according to an embodiment of the present invention.

The positive electrode 3 has grooves or protrusions with a certain width on the surface, and the grooves or protrusions are however larger than those on the negative electrode 5. The side of the positive electrode 3 having the grooves or protrusions of a certain width is organically tightly integrally joined with the semiconductor material 4. Alternatively, it is also possible to print the positive electrode 3 by means of a printing technology onto one side of the semiconductor material 4, which is smoother than the cathode 5. As for one side of the cathode 5, one side of the cathode 5 is embedded into the semiconductor material 4 by means of various structures FIG. 18 is a schematic view of various mosaic structure-4 of conformity anode and cathode according to an embodiment of the present invention.

The surface-smooth and level side of the positive electrode 3 is organically tightly integrally joined with the semiconductor material 4. Alternatively, it is also possible to print the positive electrode 3 by means of a printing technology onto one side of the semiconductor material 4, which is smoother than the cathode 5. As for one side of the cathode 5, one side of the cathode 5 is embedded into the semiconductor material 4 by means of various structures.

Figure 19:
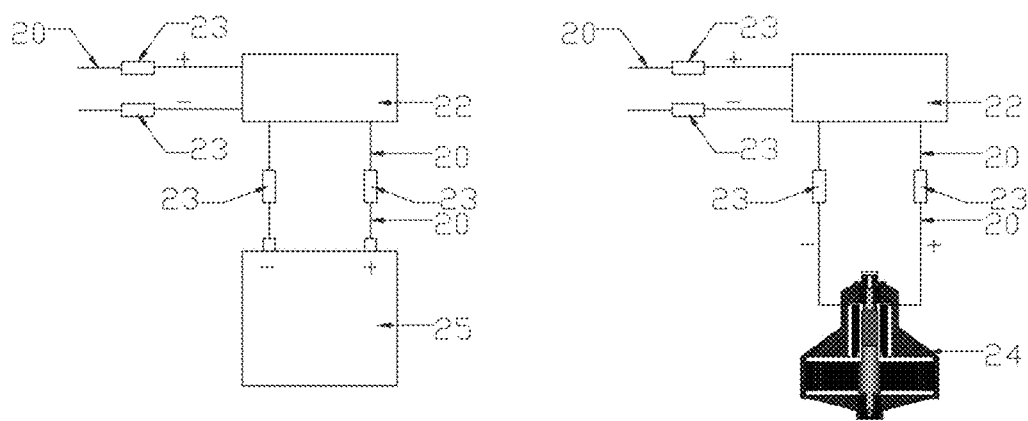
FIG. 19 is a schematic view in conformity with a energy storage device according to an embodiment of the present invention.

FIG. 19 is a schematic view in conformity with a energy storage device according to an embodiment of the present invention.

The thermal energy is converted into the electrical energy by the energy conversion device. The positive electrode 3 and the electrical transmission line 20 as well as the negative electrode 5 and the electrical transmission line 20 are connected to the anode and the cathode of the energy storage device 21, and the electrical energy generated by the energy conversion device is stored in the energy storage device 21. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

Figure 20:
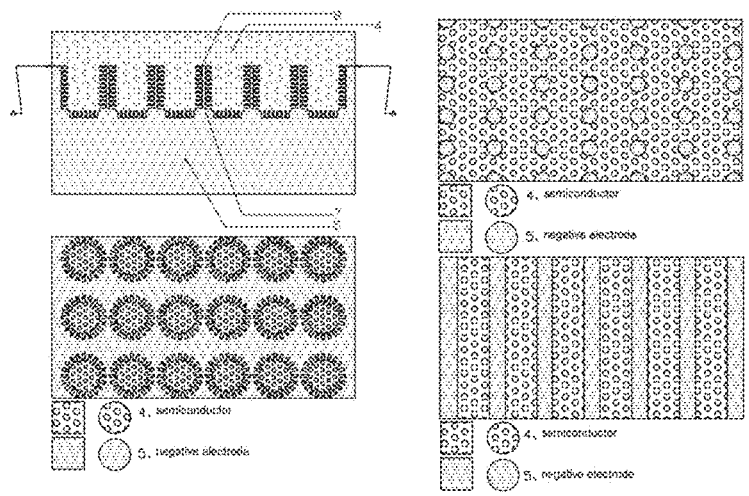
FIG. 20 is a schematic view of various mosaic structure-1 according to an embodiment of the present invention.

FIG. 20 is a schematic view in conformity with various mosaic structure-1 according to an embodiment of the present invention.

As for one side of the cathode 5, one side of the cathode 5 is embedded into the semiconductor material 4 by means of various structures. The mosaic structure 7 is formed.

Figure 21:
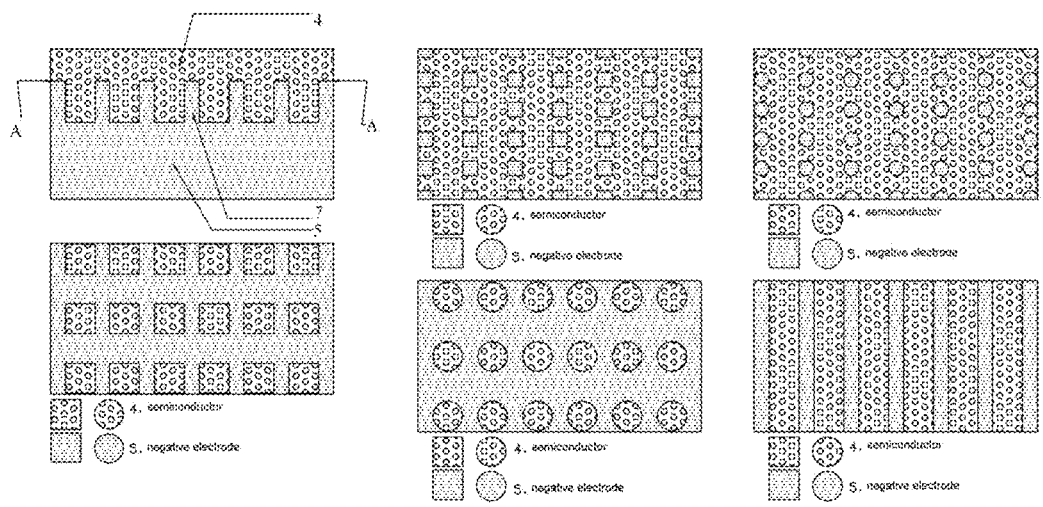
FIG. 21 is a schematic view of various mosaic structure-2 according to an embodiment of the present invention.

FIG. 21 is a schematic view in conformity with various mosaic structure-2 according to an embodiment of the present invention.

As for one side of the cathode 5, one side of the cathode 5 is embedded into the semiconductor material 4 by means of various structures. The mosaic structure 7 is formed.

Figure 22:
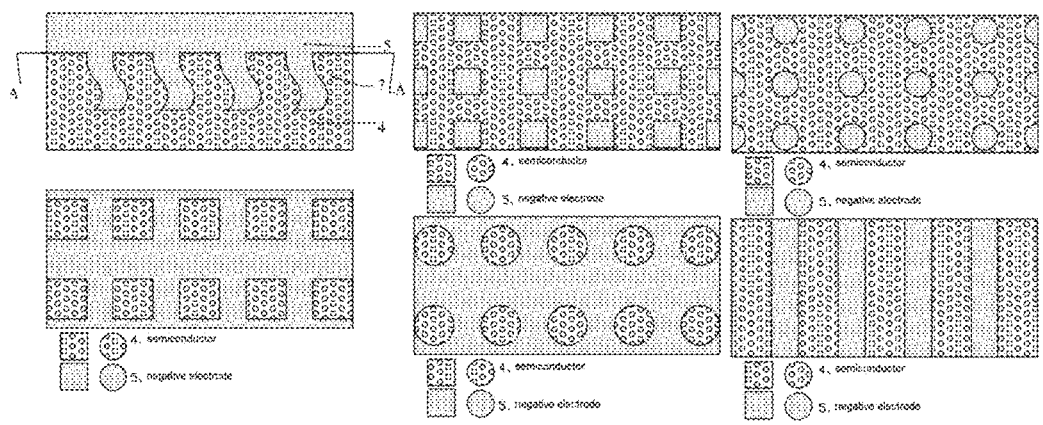
FIG. 22 is a schematic view of various mosaic structure-3 according to an embodiment of the present invention.

FIG. 22 is a schematic view in conformity with various mosaic structure-3 according to an embodiment of the present invention.

As for one side of the cathode 5, one side of the cathode 5 is embedded into the semiconductor material 4 by means of various structures. The mosaic structure 7 is formed.

Figure 23:
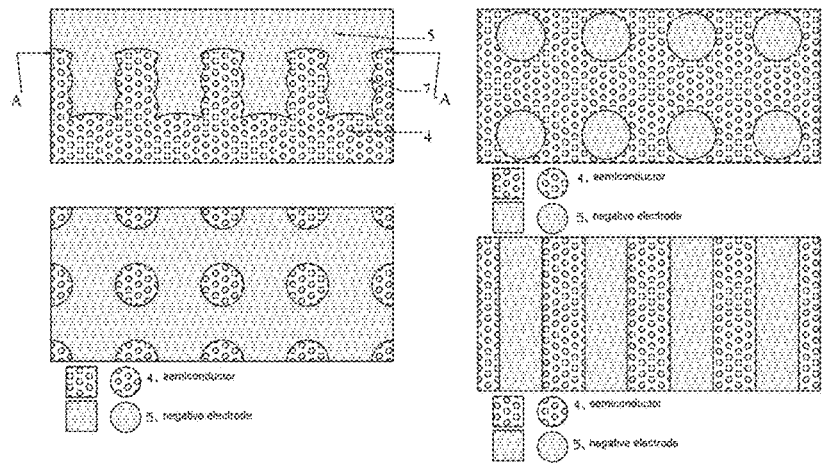
FIG. 23 is a schematic view of various mosaic structure-4 according to an embodiment of the present invention.

FIG. 23 is a schematic view in conformity with various mosaic structure-4 according to an embodiment of the present invention.

As for one side of the cathode 5, one side of the cathode 5 is embedded into the semiconductor material 4 by means of various structures. The mosaic structure 7 is formed.

Figure 24:
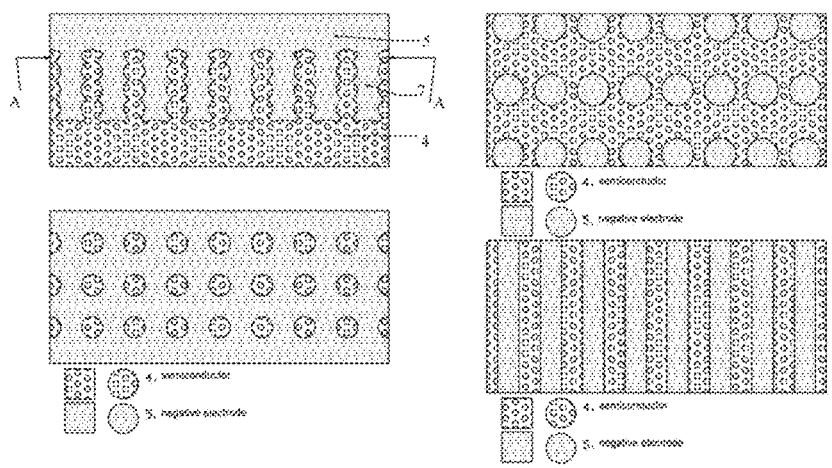
FIG. 24 is a schematic view of various mosaic structure-5 according to an embodiment of the present invention.

FIG. 24 is a schematic view in conformity with various mosaic structure-5 according to an embodiment of the present invention.

As for one side of the cathode 5, one side of the cathode 5 is embedded into the semiconductor material 4 by means of various structures. The mosaic structure 7 is formed.

A first novel temperature difference power generation device:

The novel device of the present invention comprises a vacuum tank 1, a vacuum environment 2, a high temperature end 30, a low temperature end 31, conductor material 35, semiconductor material 36, an absorption heat pipe or a superconductor heat pipe 37, a dispersion heat pipe or superconductor heat pipe 38, electrical transmission lines 20, and an energy conversion device 21.

Here, the vacuum tank 1 is at the outermost layer of the whole device to form an enclosed tank, for fixing and supporting internal energy conversion device (composed of the conductor material 35 and the semiconductor material 36 doped in the conductor material) and fixing the heat pipe or the superconductor heat pipe 37, which is at the high temperature end and absorbs the thermal energy, and the heat pipe or the superconductor heat pipe 38, which is at the low temperature end and disperse the thermal energy, in order for technically supporting the internal vacuum environment 2. The entire space within the vacuum tank forms a vacuum environment 2. The novel energy conversion device of the present invention is composed of the conductor material 35 and the semiconductor material 36 doped in the conductor material. The heat absorption end of the heat pipe or the superconductor heat pipe 37 for absorbing the thermal energy is connected with a heat source (which is a solar heat source, the energy stored by the sunlight irradiating onto a desert, terrestrial heat, and the like). The heat dispersion end of the heat pipe or the superconductor heat pipe 37 for absorbing the thermal energy is connected with the high temperature end 30 of the energy conversion device. The high temperature end 30 is connected with one side of the energy conversion device, so as to transfer the thermal energy of the heat source to the energy conversion device through the heat pipe or the superconductor heat pipe 37. The low temperature end 31 is connected with one side of the energy conversion device, and the heat absorption end of the heat pipe of the superconductor heat pipe 38 for dispersing the thermal energy is connected with the low temperature end 31. The heat dispersion end is connected with a low temperature heat source (flow) (the low temperature heat source is the flowing air, rivers, underground reservoir layer, and the like). The thermal energy, which is transferred from the high temperature end 30 of the energy conversion device, is transmitted to the low temperature heat source (flow), such that an appropriate temperature difference is kept between the high temperature end 30 and the low temperature end 31. The conductor material connected with the high temperature end 30 is switched to connect with the electrical transmission line 20, serving as the anode of the device of the present invention. The conductor material connected with the low temperature end 31 is switched to connect with the electrical transmission line 20, serving as the cathode of the device of the present invention. The electrical energy generated by the energy conversion device is transferred to the energy storage device 21 through the electrical transmission line 20. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor) 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

The technical principle of the novel temperature-difference power generation of the present invention is as follows. This device can directly generate the electrical energy by using the temperature difference. In a semiconductor, since the thermal excitation has stronger effect, the concentration of the holes (electrons) is larger on the high temperature end than the low temperature end. By the driving of such concentration gradient, the holes (electrons), due to the thermal diffusion action, would diffuse from the high temperature end toward the low temperature end, so as to form an electric potential difference, which is the principle of the temperature-difference power generation. However, with the conversional temperature difference power generation technology, to meet the requirements of this power generation technology, it is necessary to have a P(N)-semiconductor structure. For the P(N)-semiconductor material, due to the effect of the carrier density in the semiconductor, the instrinsic semiconductor, after being processed by the doping technology, will increase the number of the internal carriers, and at the same time, decrease the electrical resistance. However, these changes are limited. The number of the internal carriers is 20% of that of a conductor at most. With such construction, only less than 20% of the electron-hole pairs produced by the thermal excitation are made to be separated. Therefore, the thermal electrical conversion only can reach 5-10%. While the novel technology of the present invention found a breakthrough at this aspect, that is, the semiconductor material 36 is doped into the conductor 35, and it is possible to dope the semiconductor material 36 into the conductor 35 in the manner that atoms are spaced with each other, or it is possible to embed the semiconductor material 36 into the conductor 35 in the manner that the atoms are connected with each other. The semiconductor 36 undergoes the thermal excitation to produce electron-hole pairs, and the separated free electrons directionally enter the low temperature end (cathode) of the novel device of the present invention directly under the effect of the electrostatic field, such that the separation of the electron-hole pairs is no longer affected by the carrier density of the semiconductor 36.

Herein, the doping construction of the energy conversion device is a Jujube cake construction in which the semiconductor material 36 is doped into the conductor 35 in the manner that atoms are spaced with each other. Alternatively, it may be of a steel reinforced concrete construction in which the semiconductor material 36 may be made in form of threadlet, to be embedded in to the conductor material 35. Moreover, it may also be of the construction in which the semiconductor material 36 is made in form of a string of beads to be embedded in to the conductor material 35. Other various mosaic structures are feasible.

Figure 25:
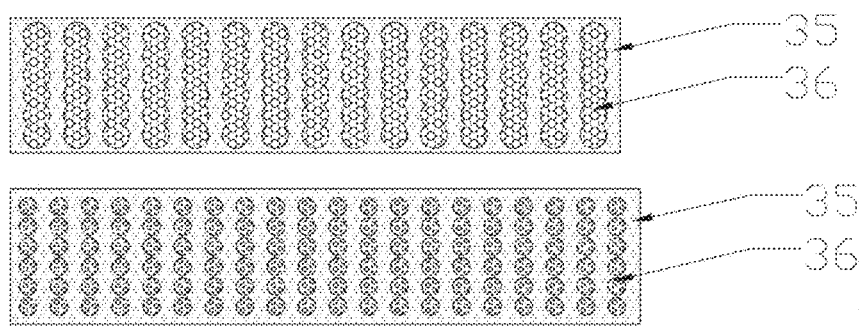
FIG. 25 is a schematic view of a doping structure in conformity with a novel temperature-difference power generation—energy conversion device according to an embodiment of the present invention.

FIG. 25 is a schematic view of a doping structure in conformity with a novel temperature-difference power generation—energy conversion device according to an embodiment of the present invention.

Figure 26:
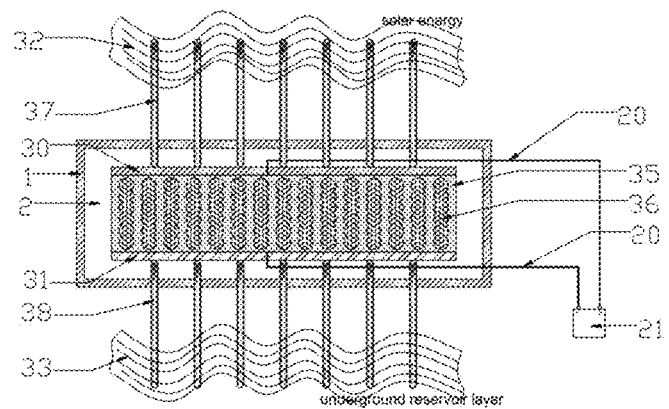
FIG. 26 is a schematic view in conformity with a novel temperature-difference power generation—solar thermal power generation 1 according to an embodiment of the present invention.

FIG. 26 is a schematic view in conformity with a novel temperature-difference power generation—solar thermal power generation 1 according to an embodiment of the present invention.

Figure 27:
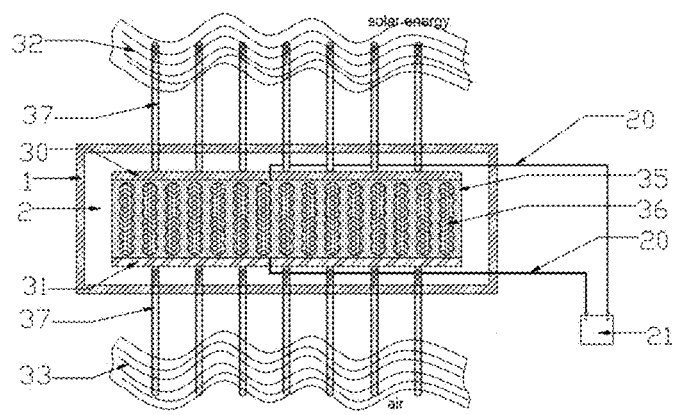
FIG. 27 is a schematic view in conformity with a novel temperature-difference power generation—solar thermal power generation 2 according to an embodiment of the present invention.

FIG. 27 is a schematic view in conformity with a novel temperature-difference power generation—solar thermal power generation 2 according to an embodiment of the present invention.

Figure 28:
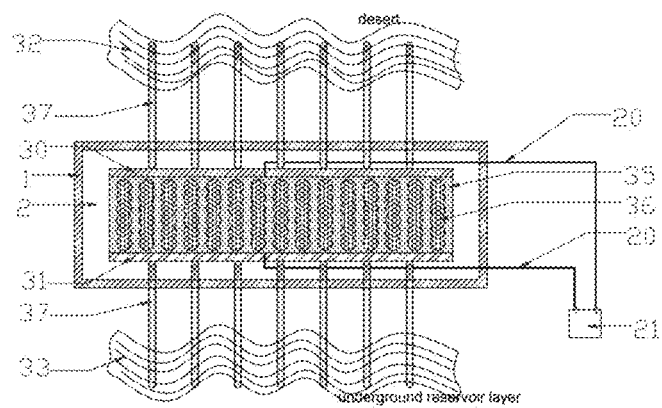
FIG. 28 is a schematic view in conformity with a novel temperature-difference power generation—desert solar thermal-storage power generation according to an embodiment of the present invention.

FIG. 28 is a schematic view in conformity with a novel temperature-difference power generation—desert solar thermal-storage power generation according to an embodiment of the present invention.

Figure 29:
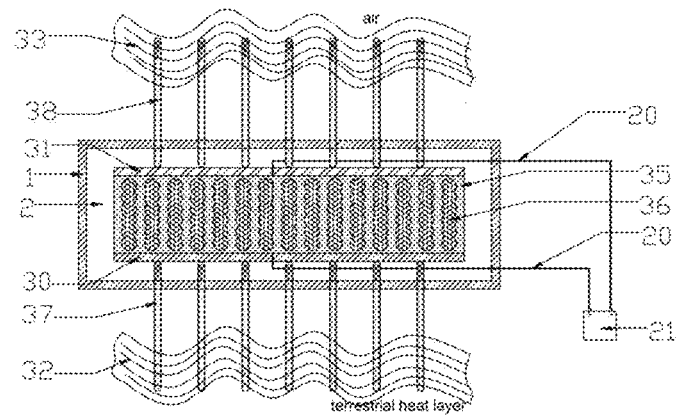
FIG. 29 is a schematic view in conformity with a novel temperature-difference power generation—terrestrial heat power generation according to an embodiment of the present invention.

FIG. 29 is a schematic view in conformity with a novel temperature-difference power generation—terrestrial heat power generation according to an embodiment of the present invention.

A second novel temperature difference power generation device:

The novel device of the present invention comprises a vacuum tank 1, a vacuum environment 2, electrical transmission lines 20, an energy storage device 21, a high temperature end 30, a low temperature end 31, a high temperature heat source 32, a low temperature heat source 33, an absorption heat pipe or a superconductor heat pipe 37, a dispersion heat pipe or superconductor heat pipe 38, semiconductor material atoms 40, doped material atoms 41, conductor material atoms 42 and an electrode 43.

Here, the vacuum tank 1 is at the outermost layer of the whole device to form an enclosed tank, for fixing and supporting internal energy conversion device (composed of semiconductor material atoms 40, doped material atoms 41, conductor material atoms 42 and an electrode 43) and fixing the heat pipe or the superconductor heat pipe 37, which is at the high temperature end and absorbs the thermal energy, and the heat pipe or the superconductor heat pipe 38, which is at the low temperature end and disperse the thermal energy, in order for technically supporting the internal vacuum environment 2. The entire space within the vacuum tank forms a vacuum environment 2. The novel energy conversion device of the present invention is composed of semiconductor material atoms 40, doped material atoms 41, conductor material atoms 42 and the electrode 43. The heat absorption end of the heat pipe or the superconductor heat pipe 37 for absorbing the thermal energy is connected with a heat source (which is a solar heat source, the energy stored by the sunlight irradiating onto a desert, terrestrial heat, and the like). The heat dispersion end of the heat pipe or the superconductor heat pipe 37 for absorbing the thermal energy is connected with the high temperature end 30 of the energy conversion device. The high temperature end 30 is connected with one side of the energy conversion device, so as to transfer the thermal energy of the heat source to the energy conversion device through the heat pipe or the superconductor heat pipe 37. The low temperature end 31 is connected with one side of the energy conversion device, and the heat absorption end of the heat pipe of the superconductor heat pipe 38 for dispersing the thermal energy is connected with the low temperature end 31. The heat dispersion end is connected with a low temperature heat source (flow) (the low temperature heat source is the flowing air, rivers, underground reservoir layer, and the like). The thermal energy, which is transferred from the high temperature end 30 of the energy conversion device, is transmitted to the low temperature heat source (flow), such that an appropriate temperature difference is kept between the high temperature end 30 and the low temperature end 31. The electrode 43 connected with the high temperature end 30 is switched to connect with the electrical transmission line 20, serving as the anode of the device of the present invention. The conductor material connected with the low temperature end 31 is switched to connect with the electrical transmission line 20, serving as the cathode of the device of the present invention. The electrical energy generated by the energy conversion device is transferred to the energy storage device 21 through the electrical transmission line 20. It is possible to firstly connect the energy conversion device with the capacitor (super capacitor) 22, so as to store the electrical energy generated by the energy conversion device into the capacitor (super capacitor) 22, and then re-store, by means of the electro-discharging, the electrical energy of the capacitor (super capacitor 22) into the inventive novel flywheel storage battery 24 of the present invention or other storage battery 25. In the circuit, in order to prevent the energy loss and the damage to the energy conversion device, which are caused by the super capacitor 22 charging the energy conversion device in the case that the generated voltage is lower than that of the super capacitor 22, it is necessary to provide a protection circuit 23 between the capacitor 22 and the energy conversion device, for example, it is necessary to connect with a Schottky diode. When the super capacitor 22 has a relatively lower voltage, in order to prevent the flywheel storage battery 24 or other storage battery 25 from affecting the super capacitor 22, one protection circuit 23 may be connected between the super capacitor 22 and the flywheel storage battery 24 or other storage battery 25, e.g., a diode and the like.

The technical principle of the novel temperature-difference power generation of the present invention is as follows. This device can directly generate the electrical energy by using the temperature difference. In a semiconductor, since the thermal excitation has stronger effect, the concentration of the holes (electrons) is larger on the high temperature end than the low temperature end. By the driving of such concentration gradient, the holes (electrons), due to the thermal diffusion action, would diffuse from the high temperature end toward the low temperature end, so as to form an electric potential difference, which is the principle of the temperature-difference power generation. However, with the conversional temperature difference power generation technology, to meet the requirements of this power generation technology, it is necessary to have a P(N)-semiconductor structure. For the P(N)-semiconductor material, due to the effect of the carrier density in the semiconductor, the instrinsic semiconductor, after being processed by the doping technology, will increase the number of the internal carriers, and at the same time, decrease the electrical resistance. However, these changes are limited. The number of the internal carriers is 20% of that of a conductor at most. With such construction, only less than 20% of the electron-hole pairs produced by the thermal excitation are made to be separated. Therefore, the thermal electrical conversion only can reach 5-10%. While the novel technology of the present invention found a breakthrough at this aspect, that is, the semiconductor material 36 is doped into the conductor 35, and it is possible to dope the semiconductor material 36 into the conductor 35 in the manner that atoms are spaced with each other, or it is possible to embed the semiconductor material 36 into the conductor 35 in the manner that the atoms are connected with each other. The semiconductor 36 undergoes the thermal excitation to produce electron-hole pairs, and the separated free electrons directionally enter the low temperature end (cathode) of the novel device of the present invention directly under the effect of the electrostatic field, such that the separation of the electron-hole pairs is no longer affected by the carrier density of the semiconductor 36.

The energy conversion device has the construction wherein the semiconductor material 40 serves as a frame platform of the whole energy conversion device and the appropriate doped material atoms 41 permeate into the semiconductor material 40. Since impurity atoms provide conductive carriers, such that the electrical resistance of the material is greatly decreased, therefore it obtains the function of doped semiconductor. Then, on the basis of this structure, conductor material atoms 42 are doped thereinto, and the conductor material atoms 42, spaced with each other, may be doped into the doped semiconductor structure (which is composed of the semiconductor material 40 and the doped material atoms 41 doped into the semiconductor material 40), and it is also possible that they are embedded into the doped semiconductor structure in various structures formed of the conductor material atoms 42, so as to constitute the novel energy conversion device of the prevent invention.

Figure 30:
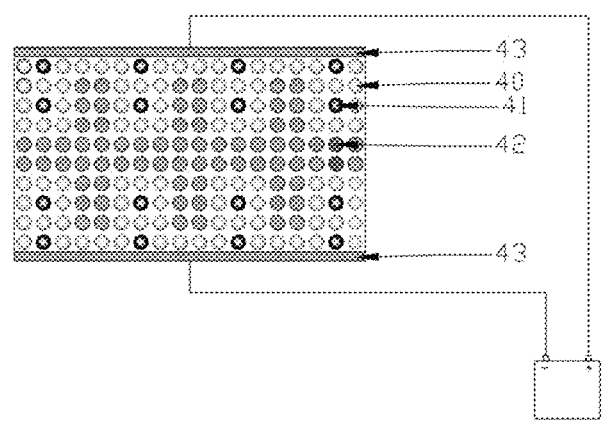
FIG. 30 is a schematic view of a doping structure in conformity with a novel temperature-difference power generation 2—energy conversion device according to an embodiment of the present invention.

FIG. 30 is a schematic view of a doping structure in conformity with a novel temperature-difference power generation 2—energy conversion device according to an embodiment of the present invention.

Figure 31:
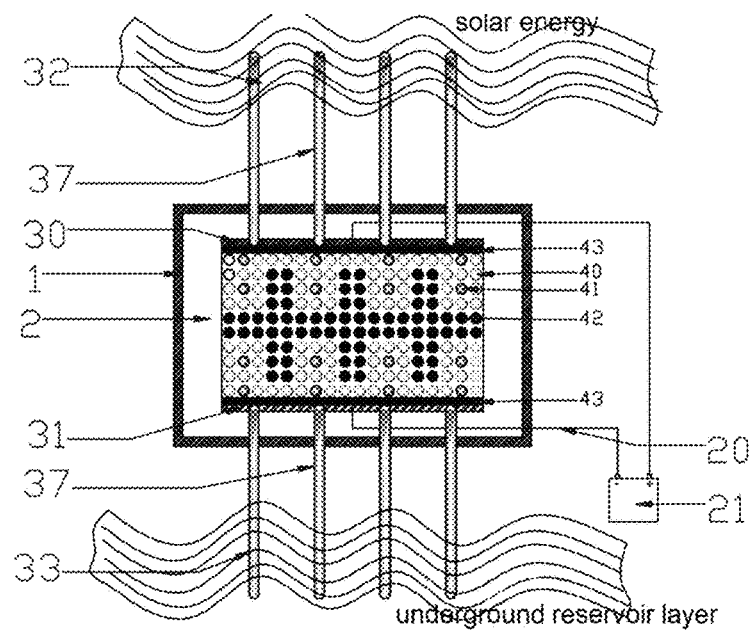
FIG. 31 is a schematic view in conformity with a novel temperature-difference power generation 2—solar thermal power generation 1 according to an embodiment of the present invention.

FIG. 31 is a schematic view in conformity with a novel temperature-difference power generation 2—solar thermal power generation 1 according to an embodiment of the present invention.

Figure 32:
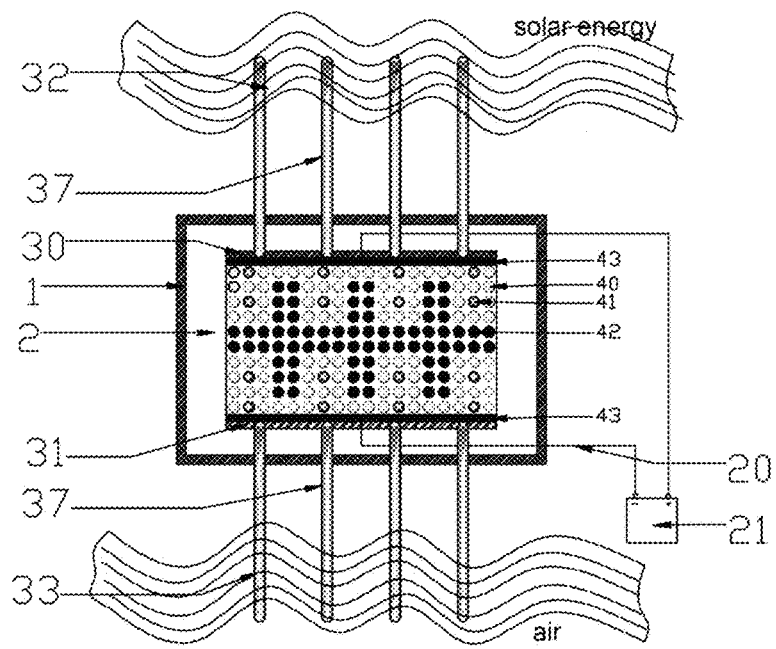
FIG. 32 is a schematic view in conformity with a novel temperature-difference power generation 2—solar thermal power generation 2 according to an embodiment of the present invention.

FIG. 32 is a schematic view in conformity with a novel temperature-difference power generation 2—solar thermal power generation 2 according to an embodiment of the present invention.

Figure 33:
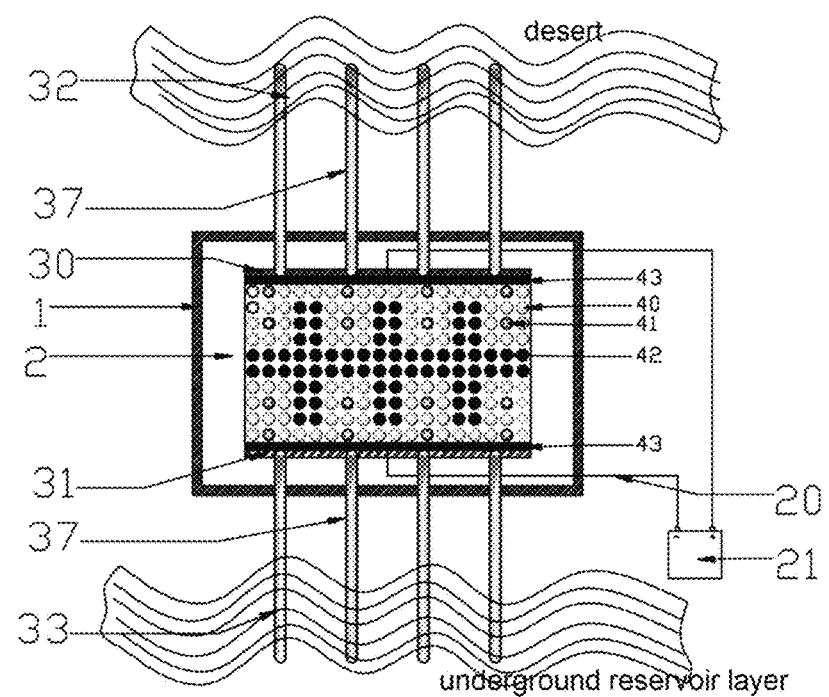
FIG. 33 is a schematic view in conformity with a novel temperature-difference power generation 2—desert solar thermal-storage power generation according to an embodiment of the present invention.

FIG. 33 is a schematic view in conformity with a novel temperature-difference power generation 2—desert solar thermal-storage power generation according to an embodiment of the present invention.

Figure 34:
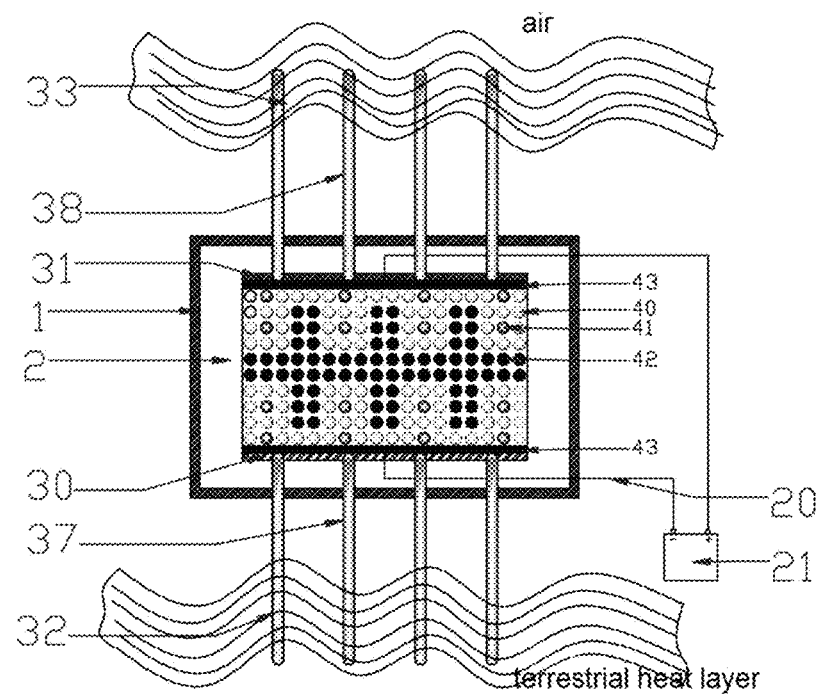
FIG. 34 is a schematic view in conformity with a novel temperature-difference power generation 2—terrestrial heat power generation according to an embodiment of the present invention.

FIG. 34 is a schematic view in conformity with a novel temperature-difference power generation 2—terrestrial heat power generation according to an embodiment of the present invention.

The preferable embodiments of the present invention are given in the above. It should be noted that when not departing from the technical principle of the present invention, one skilled in the art may make many improvements and replacements, which should be regarded as being covered by the scope of protection of the present invention.

INDUSTRIAL APPLICABILITY

The conversion and storage device of natural thermal energy according to the present invention, through collecting the thermal energy around this device and using the change of the internal features of the semiconductor in cooperation, highly effectively converts the thermal energy into the electrical energy, with convenient operations, generating a great power generation capacity and having environment protection.

The invention claimed is:

1. A conversion and storage device of natural thermal energy, comprising a thermal energy transfer system, an energy conversion device, and an energy storage device, wherein:

the thermal energy transfer system collects large-scale thermal energy by an energy absorption and extension device, transfers the thermal energy to a heating end of an absorption heat pipe or an absorption superconductor heat pipe, through the absorption heat pipe or the absorption superconductor heat pipe to the energy conversion device; the energy conversion device converts the thermal energy collected by the thermal energy transfer system into electrical energy, wherein the energy conversion device comprising a vacuum tank, a positive electrode, a semiconductor material, a negative electrode, a mosaic structure formed of the negative electrode and the semiconductor material, and an accessory structure;

wherein one side of the semiconductor material is tightly seamlessly integrally joined with the positive electrode and the other side of the semiconductor material is tightly seamlessly integrally joined with the negative electrode, and at the same time, the semiconductor material and the negative electrode are joined integrally in the mosaic structure; wherein the positive electrode is not directly connected to the mosaic structure composed of the semiconductor material and the negative electrode, and at the same time, the surface area of a contact portion between the positive electrode and the semiconductor material is less than the surface area of a contact portion between the negative electrode and the semiconductor material; and wherein the energy conversion device comprises at least one energy conversion module; and the energy storage device stores the electrical energy converted by the energy conversion device.

2. The conversion and storage device of natural thermal energy according to claim 1, wherein the thermal energy transfer system comprises the energy absorption and extension device, the absorption heat pipe or the absorption superconductor heat pipe, and an accessory supporting structure, wherein the absorption heat pipe or the absorption superconductor heat pipe has one end connected to the energy absorption and extension device, wherein the energy absorption and extension device is connected to a heat source in external environment and the other end of the absorption heat pipe or the absorption superconductor heat pipe is connected to the energy conversion device so as to transfer the thermal energy in the external environment to the energy conversion device which is composed of the positive electrode, the semiconductor material, the negative electrode, the mosaic structure formed of the negative electrode and the semiconductor material.

3. The conversion and storage device of natural thermal energy according to claim 1, wherein the energy conversion device is formed of the at least one energy conversion module, the vacuum tank, and a vacuum environment, wherein the at least one energy conversion module comprising the positive electrode, the semiconductor material, the negative electrode, the mosaic structure formed of the negative electrode and the semiconductor material and the accessory structure, wherein the vacuum tank is at the outermost layer of the energy conversion device to form an enclosed tank, which is configured to fix and support the vacuum environment, and the entire space within the vacuum tank forms the vacuum environment, wherein one side of the positive electrode is tightly seamlessly integrally joined with the semiconductor material and the other side of the positive electrode is connected to the energy storage device through a first electrical transmission line, wherein the positive electrode is formed of a first conductor material with a high electrical conductivity, in a sheet shape, a layered shape, an irregular shape, or an amorphous shape, in form of solid, liquid or plasma state; wherein the contact portion between the positive electrode and the semiconductor material represents a portion of the positive electrode which is tightly seamlessly joined with the semiconductor material; wherein the contact portion between the negative electrode and the semiconductor material represents a portion of the negative electrode which is tightly seamlessly joined with the semiconductor material; wherein the semiconductor material and the negative electrode are joined integrally in the mosaic structure, with the semiconductor material in a sheet shape, a layered shape, an irregular shape, or an amorphous shape, in form of solid, liquid or plasma state; wherein one side of the negative electrode is tightly seamlessly integrally joined with the semiconductor material while the semiconductor material and the negative electrode are joined integrally in the mosaic structure, and the other side of the negative electrode is connected to the energy storage device through a second electrical transmission line, and the negative electrode is formed of a second conductor material with a high electrical conductivity in a sheet shape, a layered shape, an irregular shape, or an amorphous shape, in form of solid, liquid or plasma state, and the negative electrode is directly connected to the mosaic structure composed of the semiconductor material and the negative electrode, such that electrons produced by the semiconductor material under thermal excitation can be guided away to form an electrical current; and wherein the mosaic structure composed of the negative electrode and the semiconductor material is a super-micro structure which comprises nano super-micro structure of 1 nm-100 nm and micron super-micro structure of 0.1 µm-10 µm, the mosaic structure comprising the negative electrode being embedded into the semiconductor material or the semiconductor being embedded into the second conductor material of the negative electrode.

4. The conversion and storage device of natural thermal energy according to claim 3, wherein the mosaic structure comprises a module selected from a group consisting of:
regular forms in which convex bodies with super-micro longitudinal or lateral widths, a super-micro height and a super-micro interval are embedded into the semiconductor material;
widely spread column structures which have a super-micro diameter, a super-micro height, and a super-micro distance are embedded into the semiconductor material;
widely spread cavity structures which have a super-micro diameter, a super-micro depth, and a super-micro distance are embedded into the semiconductor material;
cavity structures in a cube form with a super-micro width multiplying a super-micro length, a super-micro depth, and a super-micro distance are embedded into the semiconductor material;
cavity structures in a cube form with a super-micro length multiplying a super-micro width, a super-micro convex height, and a super-micro distance are embedded into the semiconductor material;
wherein the mosaic structure further comprises organism-like small intestinal chorionic structure, the negative electrode being embedded into the semiconductor material; and
wherein the mosaic structure further comprises irregular forms including the negative electrode being immersed into the semiconductor material or the negative electrode being dissolved into the semiconductor material, and at the same time, the negative electrode being connected to a negative electrode of the energy storage device through the second electrical transmission line.

5. The conversion and storage device of natural thermal energy according to claim 1, wherein the energy conversion device is composed of the vacuum tank, a vacuum environment, the negative electrode, the semiconductor material, wherein the energy conversion device is connected to the absorption heat pipe or the absorption superconductor heat pipe and a dissipation heat pipe or a dissipation superconductor heat pipe, wherein the vacuum tank is at the outermost layer of the energy conversion device to form an enclosed tank which is configured to fix and support the at least one energy conversion module, secure the absorption heat pipe or the absorption superconductor heat pipe for absorbing thermal energy at a high temperature end of the energy conversion device and secure the dissipation heat pipe or the dissipation superconductor heat pipe for dispersing thermal energy at a low temperature end of the energy conversion device, and the entire space within the vacuum tank forms the vacuum environment, the energy conversion device is composed of the negative electrode and the semiconductor material embedded or doped into the negative electrode, the heating end of the absorption heat pipe or the absorption superconductor heat pipe for absorbing thermal energy is connected to a heat source, a dispersing end of the absorption heat pipe or the absorption superconductor heat pipe for dispersing thermal energy is connected to the high temperature end of the energy conversion device, the high temperature end of the energy conversion device transfers the thermal energy of the heat source to the at least one energy conversion module through the absorption heat pipe or the absorption superconductor heat pipe, the low temperature end of the energy conversion device is connected to an absorbing heat end of the dissipation heat pipe or the dissipation superconductor heat pipe, a dispersing end of the dissipation heat pipe or the dissipation superconductor heat pipe is connected to a low temperature heat source so as to transfer the thermal energy transmitted from the high temperature end of the energy conversion device to the low temperature heat source, such that the high temperature end and the low temperature end of the energy conversion device are kept at a corresponding temperature difference therebetween, wherein the semiconductor material is embedded or doped into the negative electrode, such that atoms of the semiconductor material spaced from each other can be embedded or doped to the negative electrode or atoms of the semiconductor material connected to each other are embedded into the negative electrode, and the semiconductor material upon undergoing a thermal excitation generates electron-hole pairs, and separated free electrons directly enter the negative electrode directionally under effect of an electrostatic field, therefore separation of the electron-hole pairs is no longer affected by carrier density in the semiconductor material.

6. The conversion and storage device of natural thermal energy according to claim 1, wherein the energy conversion device comprises the vacuum tank, a vacuum environment, a high temperature end, a low temperature end, the semiconductor material or semiconductor atoms, doped material or doped atoms, the negative electrode, and the positive electrode, wherein the vacuum tank is at the outermost layer of the energy conversion device to form an enclosed tank, which is configured to fix and support the at least one energy conversion module and secure the absorption heat pipe or the absorption superconductor heat pipe for absorbing thermal energy at the high temperature end and a dissipation heat pipe or a dissipation superconductor heat pipe for dispersing thermal energy at the low temperature end, and the energy conversion device is composed of the semiconductor material or semiconductor atoms, doped material or doped atoms, negative electrode, and the positive electrode, the heating end of the absorption heat pipe or the absorption superconductor heat pipe for absorbing thermal energy is connected to a heat source, a dispersing end of the absorption heat pipe or the absorption superconductor heat pipe for dispersing thermal energy is connected to the high temperature end of the energy conversion device, so as to transfer the thermal energy of the heat source to the energy conversion device through the absorption heat pipe or the absorption superconductor heat pipe, an absorbing end of the dissipation heat pipe or the dissipation superconductor heat pipe for dispersing thermal energy is connected to the low temperature end, a dispersing end of the dissipation heat pipe or the dissipation superconductor heat pipe is connected to a low temperature heat source so as to transfer the thermal energy transmitted from the high temperature end of the energy conversion device to the low temperature heat source, such that the high temperature end and the low temperature end are kept at a corresponding temperature difference therebetween, the positive electrode connected to the high temperature end is connected to a first electrical transmission line, the negative electrode connected to the low temperature end is connected to a second electrical transmission line, and the electrical energy generated by the energy conversion device is transferred to the energy storage device through the first electrical transmission line and the second electrical transmission line, the energy conversion device has a construction in which the semiconductor material, as a frame platform of the energy conversion device, is permeated with appropriate doping material or doping atoms, wherein the semiconductor is further doped with the negative electrode or atoms of the negative electrode, wherein the negative electrode or the atoms of the negative electrode spaced from each other are doped into the doped semiconductor structure or various structures composed of the atoms of the negative electrode are embedded into the doped semiconductor structure, for forming the energy conversion device, wherein the positive electrode and the negative electrode of the energy conversion device are determined such that the high temperature end serves as the positive electrode and the low temperature end serves as the negative electrode, both of the positive and negative electrodes are connected to the semiconductor material, while the positive electrode is not directly connected to the negative electrode which however is capable of being in electrical communication with the negative electrode and the atoms of the negative electrode doped into the semiconductor.

7. The conversion and storage device of natural thermal energy according to claim 1, wherein the negative electrode comprises a material that is solid, liquid, gas or plasma; and the semiconductor material is solid, liquid, gas or plasma.

8. The conversion and storage device of natural thermal energy according to claim 1, wherein the energy storage device is composed of an electrical transmission line, capacitors or super capacitors, a flywheel energy storage battery; the positive electrode and the negative electrode of the energy conversion device are connected to the energy storage device through the electrical transmission line, so as to store the electrical energy generated by the energy conversion device in the energy storage device, wherein the electrical transmission line has one end connected to the positive and negative electrodes and the other end connected to the capacitor or a super capacitor so as to store the electrical energy generated by the energy conversion device in the capacitor or the super capacitor, and the electrical energy in the capacitor or the super capacitor is re-stored into the flywheel energy storage battery through electro-discharge.

9. The conversion and storage device of natural thermal energy according to claim 8, wherein a protection circuit is provided between the capacitor and the energy conversion device.

10. The conversion and storage device of natural thermal energy according to claim 8, wherein a protection circuit is provided between the super capacitor and the energy conversion device.

11. The conversion and storage device of natural thermal energy according to claim 2, wherein the heat source comprises solar energy, air, rivers, oceans, underground heat, desert, thermal energy, afterheat, and waste heat produced in industrial and agricultural fields, and thermal energy, afterheat, and waste heat generated during human life.

* * * * *